(12) United States Patent
Marbell et al.

(10) Patent No.: US 12,230,614 B2
(45) Date of Patent: Feb. 18, 2025

(54) MULTI-TYPED INTEGRATED PASSIVE DEVICE (IPD) COMPONENTS AND DEVICES AND PROCESSES IMPLEMENTING THE SAME

(71) Applicant: WOLFSPEED, INC., Durham, NC (US)

(72) Inventors: Marvin Marbell, Cary, NC (US); Haedong Jang, San Jose, CA (US); Jeremy Fisher, Raleigh, NC (US); Basim Noori, Durham, NC (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 567 days.

(21) Appl. No.: 17/555,015

(22) Filed: Dec. 17, 2021

(65) Prior Publication Data

US 2023/0197698 A1    Jun. 22, 2023

(51) Int. Cl.
*H01L 25/16* (2023.01)
*H01L 23/00* (2006.01)

(52) U.S. Cl.
CPC .............. *H01L 25/16* (2013.01); *H01L 24/32* (2013.01); *H01L 24/48* (2013.01); *H01L 24/73* (2013.01); *H01L 2224/32245* (2013.01); *H01L 2224/48137* (2013.01); *H01L 2224/48195* (2013.01); *H01L 2224/49111* (2013.01); *H01L 2224/49175* (2013.01); *H01L 2224/73265* (2013.01); *H01L 2924/10272* (2013.01); *H01L 2924/1033* (2013.01); *H01L 2924/1205* (2013.01); *H01L 2924/1305* (2013.01); *H01L 2924/13055* (2013.01); *H01L 2924/13062* (2013.01); *H01L 2924/13063* (2013.01); *H01L 2924/13064* (2013.01); *H01L 2924/13091* (2013.01); *H01L 2924/19011* (2013.01); *H01L 2924/19105* (2013.01)

(58) Field of Classification Search
None
See application file for complete search history.

(56) References Cited

U.S. PATENT DOCUMENTS

| 7,078,310 | B1 | 7/2006 | Kar-Roy et al. |
| 8,143,699 | B2 | 3/2012 | Ching et al. |
| 9,153,504 | B2 | 10/2015 | Lai et al. |
| 9,966,426 | B2 | 5/2018 | Mudakatte et al. |
| 10,290,701 | B1 | 5/2019 | Chang |

(Continued)

OTHER PUBLICATIONS

International Patent Application No. PCT/US2022/081740; Int'l Search Report and the Written Opinion; dated Mar. 10, 2023; 9 pages.

(Continued)

*Primary Examiner* — Michelle Mandala
*Assistant Examiner* — Jordan M Klein
(74) *Attorney, Agent, or Firm* — BakerHostetler

(57) ABSTRACT

A transistor device includes a metal submount; a transistor die arranged on said metal submount; a first integrated passive device (IPD) component that includes a first substrate arranged on said metal submount; and a second integrated passive device (IPD) component that includes a second substrate arranged on the metal submount. Additionally, the first substrate is a different material from the second substrate.

32 Claims, 26 Drawing Sheets

(56) References Cited

U.S. PATENT DOCUMENTS

| | | |
|---|---|---|
| 2004/0061214 A1 | 4/2004 | Crescenzi |
| 2005/0121744 A1 | 6/2005 | Chang et al. |
| 2007/0297120 A1 | 12/2007 | Ren et al. |
| 2011/0031586 A1 | 2/2011 | Kang et al. |
| 2013/0264716 A1 | 10/2013 | Lin et al. |
| 2014/0036405 A1 | 2/2014 | Takeoka et al. |
| 2015/0244410 A1 | 8/2015 | Leong et al. |
| 2016/0126905 A1* | 5/2016 | Zhao ............... H03F 1/565 330/250 |
| 2018/0131329 A1 | 5/2018 | Tong |
| 2018/0323159 A1 | 11/2018 | Kamgaing et al. |
| 2020/0204119 A1* | 6/2020 | Roberts ............. H03F 3/195 |
| 2020/0227366 A1 | 7/2020 | Dogiamis et al. |
| 2020/0411555 A1 | 12/2020 | Hall et al. |
| 2021/0126593 A1* | 4/2021 | Roberts ............. H01L 23/66 |
| 2021/0175860 A1* | 6/2021 | Roberts ............. H03F 3/213 |
| 2021/0175866 A1* | 6/2021 | Li ..................... H03F 3/2171 |
| 2021/0202408 A1* | 7/2021 | Khalil ............... H01L 24/06 |
| 2021/0265249 A1 | 8/2021 | Komposch et al. |
| 2021/0265250 A1 | 8/2021 | Marbell et al. |
| 2021/0313285 A1 | 10/2021 | Noori et al. |
| 2021/0313293 A1 | 10/2021 | Noori et al. |
| 2021/0391234 A1 | 12/2021 | Lan et al. |

OTHER PUBLICATIONS

International Patent Application No. PCT/US2022/081759; Int'l Search Report and the Written Opinion; dated Mar. 16, 2023; 11 pages.

International Patent Application No. PCT/US2022/081752; Int'l Search Report and the Written Opinion; dated Sep. 21, 2023; 12 pages.

* cited by examiner

MULTI-TYPED INTEGRATED PASSIVE DEVICE (IPD) COMPONENTS AND DEVICES AND PROCESSES IMPLEMENTING THE SAME

FIELD OF THE DISCLOSURE

The disclosure relates to multiple types of integrated passive device (IPD) components, a device implementing multiple types of IPD components, a process of implementing multiple types of IPD components, a process for implementing a device having multiple types of IPD components.

BACKGROUND OF THE DISCLOSURE

Transistor packages such as radio frequency (RF) power amplifier transistor products implement IPD components. Typically, the IPD components are mounted on printed circuit board (PCB) based substrates, silicon (Si) based substrates, and/or the like.

However, the PCB based substrates, Si-based substrates, and/or the like have a number of drawbacks. In particular, these components can implement only a limited number of components. This increases manufacturing cost, manufacturing complexity, and limits functionality. Moreover, the configuration and arrangement of these components is very limited. Likewise, this increases manufacturing cost, manufacturing complexity, and limits functionality. Additionally, these components can be very large and consume substantial area or real estate within the transistor package. This limits functionality of the components.

Accordingly, what is needed is IPD components, a RF product that implements IPD components, and/or the like configured for utilization of a number of components, increased functionality, and efficient utilization of space.

SUMMARY OF THE DISCLOSURE

One general aspect includes a transistor device that includes a metal submount; a transistor die arranged on said metal submount; a first integrated passive device (IPD) component that includes a first substrate arranged on said metal submount; and a second integrated passive device (IPD) component that includes a second substrate arranged on the metal submount, where the first substrate is a different material from the second substrate.

One general aspect includes a process for implementing a transistor device that includes providing a metal submount; arranging a transistor die on said metal submount; arranging a first integrated passive device (IPD) component that includes a first substrate on said metal submount; and arranging a second integrated passive device (IPD) component that includes a second substrate on the metal submount, where the first substrate is a different material from the second substrate.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
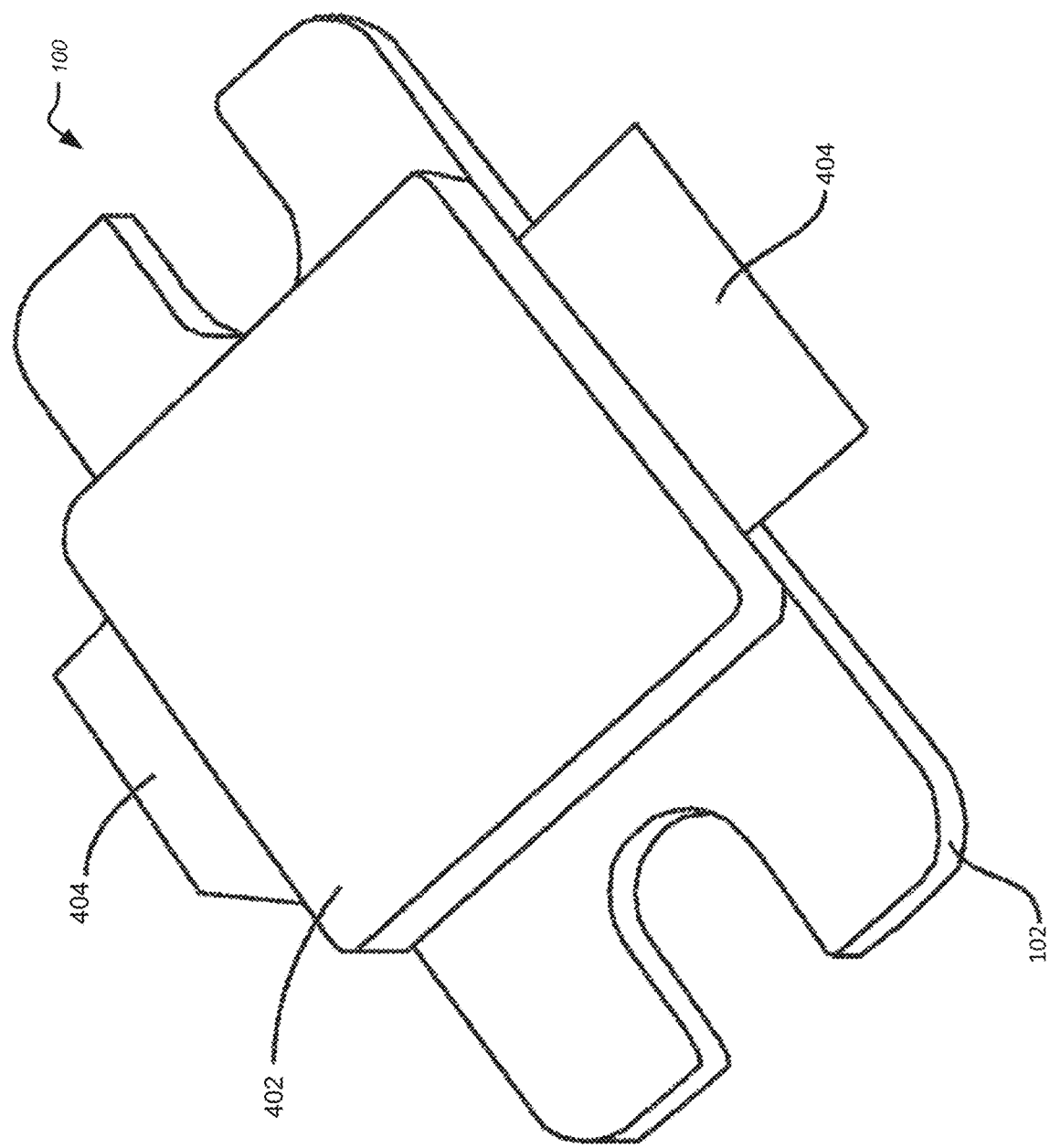
FIG. 1 illustrates a perspective view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosure relates to composite IPD components, a device implementing composite IPD components, a process of implementing composite IPD components, a process for implementing a device having composite IPD components. The disclosure further relates to hybrid IPD components, a device implementing hybrid IPD components, a process of implementing hybrid IPD components, a process for implementing a device having hybrid IPD components.

The disclosure further relates to a radio frequency (RF) package implementing a radio frequency (RF) device with hybrid/composite implementations of IPD components. The disclosure further relates to a radio frequency (RF) power amplifier transistor package implementing an RF device with hybrid/composite implementations of IPD components. The disclosure further relates to a process of making hybrid/composite implementations of IPD components. The disclosure further relates to a process of making a package implementing hybrid/composite implementations of IPD components. The disclosure further relates to a process of making an RF package implementing an RF device with hybrid/composite implementations of IPD components. The disclosure further relates to a process of making a Radio frequency (RF) power amplifier transistor package implementing hybrid/composite implementations of IPD components.

The disclosure further relates to a radio frequency (RF) package implementing a radio frequency (RF) device with multiple types of IPD components. The disclosure further relates to a radio frequency (RF) power amplifier transistor package implementing an RF device with multiple types of IPD components. The disclosure further relates to a process of making multiple types of IPD components. The disclosure further relates to a process of making a package implementing multiple types of IPD components. The disclosure further relates to a process of making an RF package implementing an RF device with multiple types of IPD components. The disclosure further relates to a process of making a Radio frequency (RF) power amplifier transistor package implementing multiple types of IPD components.

The disclosure is directed to IPD components. In particular, the disclosure is directed to IPD components that may implement a strategic combination of silicon carbide (SiC) IPDs and PCB-based IPDs for RF pre-matching, base-band decoupling, and/or the like in RF power products, other products and/or other applications.

Additionally, the disclosure is directed to IPD components that may implement smaller form-factor SiC capacitor IPDs combined with larger sized PCB-IPDs. The smaller form-factor SiC capacitor IPDs may reduce cost, provide high cap density, and/or the like. The larger sized PCB-IPDs may provide greater coverage, may implement thick metallization on traces, and/or the like.

In some aspects, the SiC capacitor IPDs may be attached directly to a package flange through cut-out holes or routed corners in PCB-IPDs. In some aspects, the SiC IPDs may be attached directly to a flange, with the PCB-IPDs attached on top of them forming routing layers, interconnects, and/or the like to other PCB bond pads, PCB grounded pads, and/or the like.

In aspects, the IPD components may be used for matching networks, pre-matching, bias-decoupling, thermal-grounding, and/or the like in RF power products and/or the like. The IPD components may be placed inside a package, such as an open cavity package or over-mold package, together with transistor die, such as Gallium nitride (GaN) transistor die, and other capacitors, IPDs, and/or the like and connected with wire bonds to each other and to package leads. Metallization on the top and bottom of the substrate, together with vias routed through the substrate may enable the creation of bond-pads, inductive strips, inductive coils, capacitive stubs, and/or the like. In addition, surface mount devices (SMDs) components, such as capacitors, resistors, inductors, and/or the like may be attached, for example soldered, on top of the IPD components.

In aspects, the IPD components may implement small form factor SiC capacitor IPDs that may reduce overall cost compared to making an entire IPD on a SiC substrate. Additionally, the IPD components may take advantage of a high cap density, a high-Q, a lower height profile, a better thermal performance, and/or the like of SiC capacitors compared to mounting SMD capacitors on PCB substrates. Moreover, the IPD components may utilize in some aspects PCB technology that has thicker metal traces (for example, traces having 17-35 microns of copper) compared to SiC traces (for example, traces having 3-6 microns of Au), which works well for high power handling.

In aspects, the IPD components may have high volume resistivity and low leakage of both SiC substrates and PCB substrates and may contribute to high-Q and low loss IPDs. Additionally, the IPD components implementing SiC capacitor IPDs may have much better thermal performance, handling of SMD components, and/or the like. Moreover, the IPD components may be configured for direct attach of the SiC IPDs to a package flange that may provide a low thermal resistance path for heat transfer. Further, the IPD components may include cut outs, routed corners, holes, cutout pockets, and/or the like in the PCB IPD that may allow the SiC IPDs to be placed closer to a transistor die, minimize trace loss, minimize inductance, and/or the like. Additionally, the IPD components may include printed low-profile traces on the PCB-IPD implementations that may provide better inductance control (for low values) than wire-bond loops.

FIG. 1 illustrates a perspective view of a package according to the disclosure.

Figure 2:
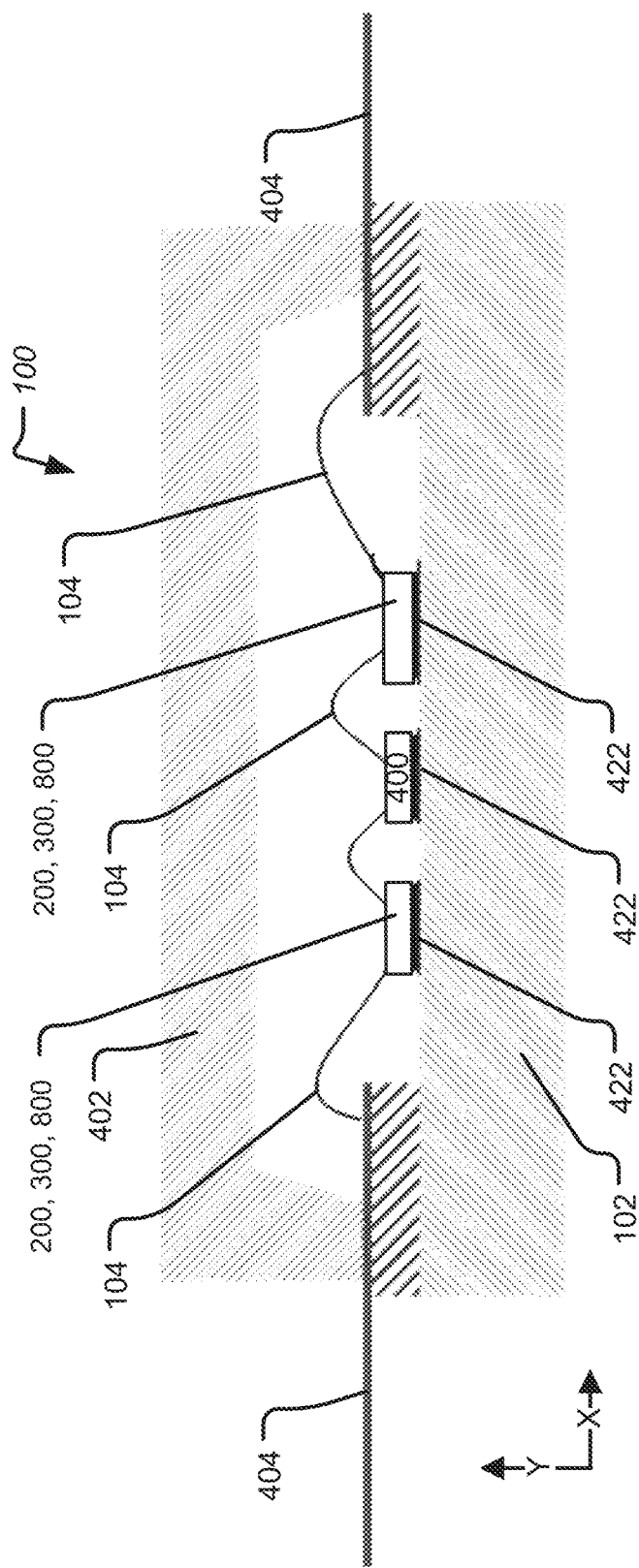
FIG. 2 illustrates a cross-sectional view of the package according to the disclosure.

FIG. 2 illustrates a cross-sectional view of the package according to the disclosure.

Figure 3:
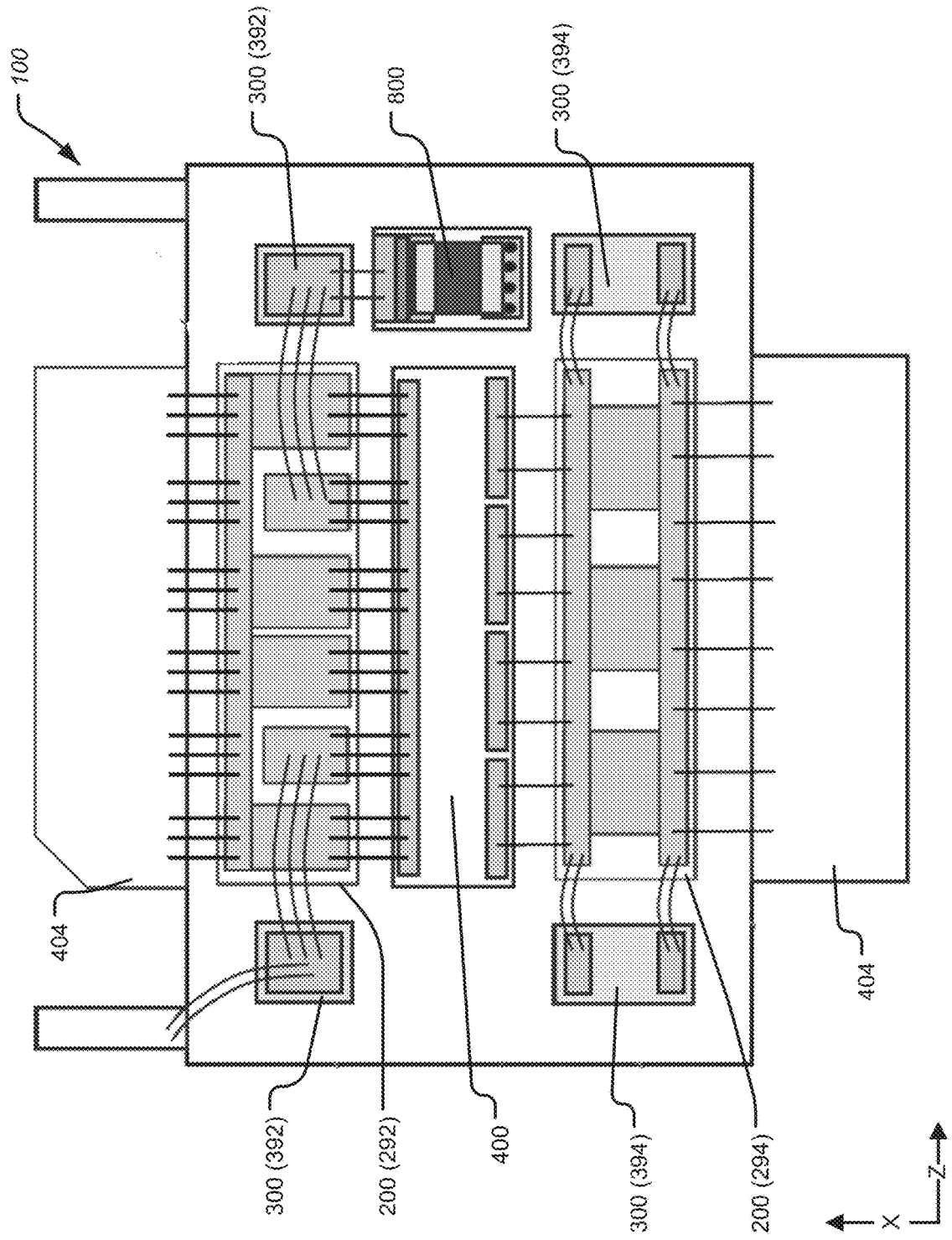
FIG. 3 illustrates a partial top view of the package according to a particular aspect of the disclosure.

FIG. 3 illustrates a partial top view of the package according to a particular aspect of the disclosure.

Figure 4:
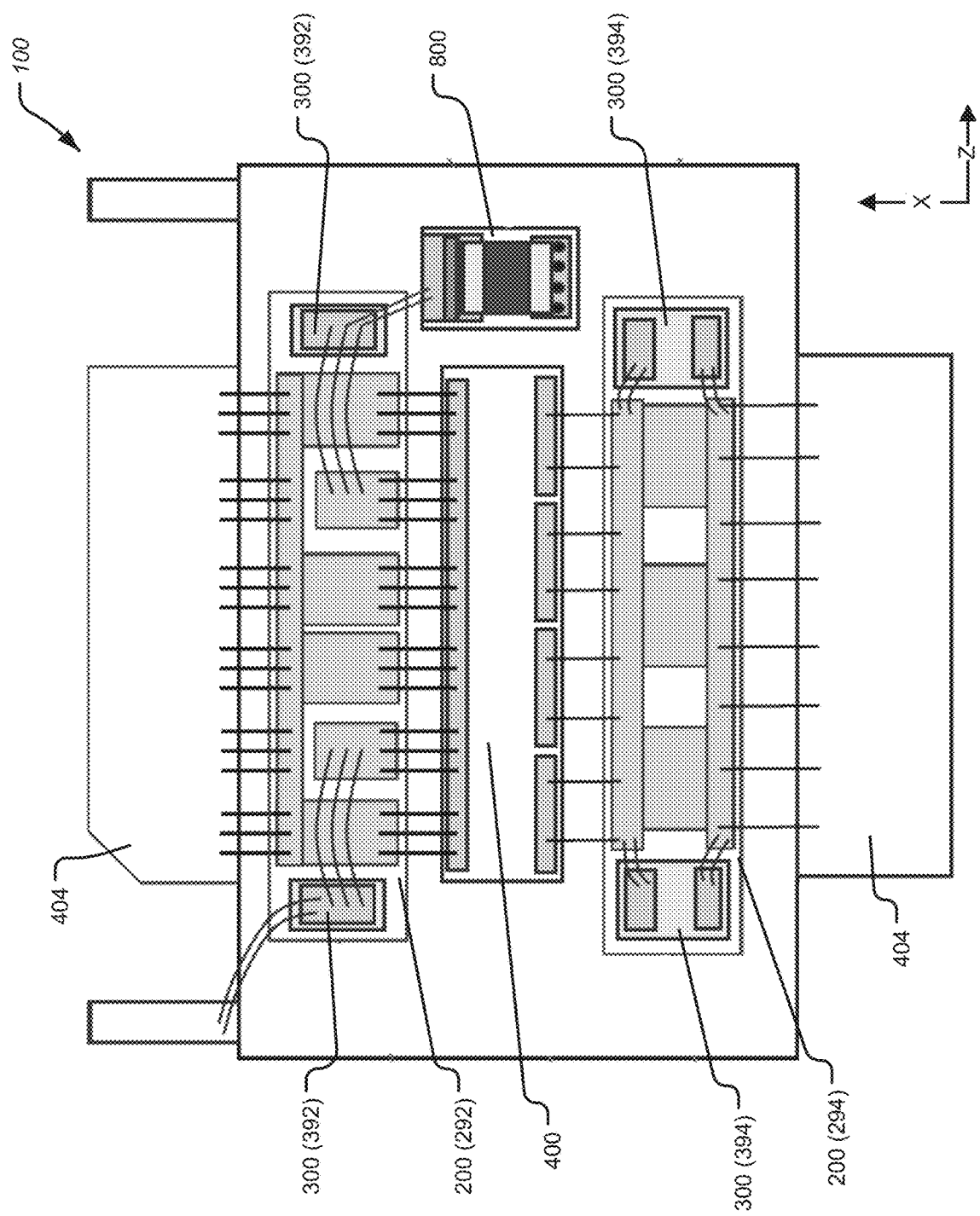
FIG. 4 illustrates a partial top view of the package according to another particular aspect of the disclosure.

FIG. 4 illustrates a partial top view of the package according to another particular aspect of the disclosure.

The aspects of FIG. 1, FIG. 2, FIG. 3, and FIG. 4 may include any one or more features as described herein. In particular, FIG. 1, FIG. 2, FIG. 3, and FIG. 4 show an exemplary implementation of a package 100 that may include any one or more other features, components, arrangements, and the like as described herein. In particular, FIG. 1, FIG. 2, FIG. 3, and FIG. 4 show the package 100 that may be implemented as a RF package, a RF amplifier package, a RF power amplifier package, a RF power transistor package, a RF power amplifier transistor package, and/or the like as described herein.

The package 100 may include one or more semiconductor devices 400, a support 102, at least one or more of a first IPD component 200, a second IPD component 300, and a third IPD component 800. In aspects, the package 100 may include a plurality of the first IPD component 200, the second IPD component 300, and/or the third IPD component 800; and in aspects the package 100 may include a single implementation of one or more of the first IPD component 200, the second IPD component 300, and/or the third IPD component 800.

In aspects, the first IPD component 200 may be implemented as a PCB IPD component, an IPD component having a PCB substrate, and/or the like. In aspects, the second IPD component 300 may be implemented as a SiC IPD component, an IPD component having a SiC substrate, and/or the like. In aspects, the third IPD component 800 may be implemented as a PCB IPD component, an IPD component having a PCB substrate, and/or the like. In aspects, the first IPD component 200 may utilize a substrate material that is different from a substrate material of the second IPD component 300. In aspects, the first IPD component 200 may utilize a substrate material that is the same as a substrate material of the third IPD component 800.

The first IPD component 200, the second IPD component 300, and/or the third IPD component 800 may be implemented as at least part of a RF device as described herein. The first IPD component 200, the second IPD component 300, and/or the third IPD component 800 may implement matching networks, harmonic termination circuitry, integrated passive devices (IPD), capacitors, resistors, inductors, and/or the like.

In aspects, the second IPD component 300 may be implemented as a smaller form-factor SiC capacitor IPD combined with the first IPD component 200 implemented as a larger sized PCB-IPD. The implementation of the second IPD component 300 as a smaller form-factor SiC capacitor IPDs may reduce cost, provide high cap density, and/or the like. The implementation of the first IPD component 200 as a larger sized PCB-IPD may provide greater coverage, may implement thick metallization on traces, and/or the like.

In some aspects, the second IPD component 300 may be implemented as a SiC capacitor IPD that may be attached directly to the support 102, such as a package flange, through cut-out holes or routed corners in the first IPD component 200 implemented as a PCB-IPD. In some aspects, the second IPD component 300 may be implemented as a SiC IPD and may be attached directly to the support 102, such as a flange, with the first IPD component 200 implemented as a PCB-IPD attached on top of the second IPD component 300 and the first IPD component 200 forming routing layers, interconnects, and/or the like to other PCB bond pads, PCB grounded pads, and/or the like.

In aspects, the first IPD component 200, the second IPD component 300, and/or the third IPD component 800 may be used for matching networks, pre-matching, bias-decoupling, thermal-grounding, and/or the like in RF power products and/or the like. The first IPD component 200, the second IPD component 300, and/or the third IPD component 800 may be placed inside a package, such as an open cavity package or over-mold package, together with transistor die, such as Gallium nitride (GaN) transistor die, and other capacitors, IPDs, and/or the like and connected with wire bonds to each other and to package leads. Metallization on the top and bottom of the substrate, together with vias routed through the substrate may enable the creation of bond-pads, inductive strips, inductive coils, capacitive stubs, and/or the like. In addition, surface mount devices (SMDs) components, such as capacitors, resistors, inductors, and/or the like may be attached, for example soldered, on top of the IPD components.

In aspects, the second IPD component 300 may be implemented as a small form factor SiC capacitor IPD that may reduce overall cost compared to making an entire IPD on a SiC substrate. Additionally, the second IPD component 300 may take advantage of a high cap density, a high-Q, a lower height profile, a better thermal performance, and/or the like of SiC capacitors compared to mounting SMD capacitors on PCB substrates. Moreover, the first IPD component 200 and/or the third IPD component 800 may utilize in some aspects PCB technology that has thicker metal traces (for example, traces having 17-35 microns of copper) compared to SiC traces (for example, traces having 3-6 microns of Au), which works well for high power handling.

In aspects, the first IPD component 200, the second IPD component 300, and/or the third IPD component 800 may have high volume resistivity and low leakage of both SiC substrates and PCB substrates and may contribute to high-Q and low loss IPDs. Additionally, the second IPD component 300 implemented as a SiC capacitor IPD may have much better thermal performance, handling of SMD components, and/or the like. Moreover, the first IPD component 200 may be configured for direct attach of the second IPD component 300 implemented as a SiC IPD to the support 102, such as a package flange, that may provide low thermal resistance path for heat transfer. Further, the first IPD component 200 may include cut outs, routed corners, holes, cutout pockets, and/or the like that may allow the second IPD component 300 implemented as a SiC IPD to be placed closer to the one or more semiconductor devices 400, such as a transistor die, to minimize trace loss, minimize inductance, and/or the like. Additionally, the first IPD component 200 and/or the third IPD component 800 may include printed low-profile traces on PCB-IPD implementations that may provide better inductance control (for low values) than wire-bond loops.

The one or more semiconductor devices 400 may be implemented as one or more of a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration, and/or the like.

The package 100 may be implemented to include an open cavity configuration suitable for use with the first IPD component 200, the second IPD component 300, and the third IPD component 800 of the disclosure. In particular, the open cavity configuration may utilize an open cavity package design. In some aspects, the open cavity configuration may include a lid or other enclosure for protecting interconnects, circuit components, the first IPD component 200, the second IPD component 300, the third IPD component 800 the one or more semiconductor devices 400, and/or the like. The package 100 may include a ceramic body 402 and one or more metal contacts 404. In other aspects, the package 100 may include a plurality of the one or more metal contacts 404; and in aspects the package 100 may include a plurality of parallel implementations of the one or more metal contacts 404 and parallel implementations of the one or more semiconductor devices 400, the first IPD component 200, the second IPD component 300, the third IPD component 800, and/or the like.

Inside the package 100, the one or more semiconductor devices 400 may be attached to the support 102 via a die attach material 422. One or more interconnects 104 may couple the one or more semiconductor devices 400 to a first one of the one or more metal contacts 404, a second one of the one or more metal contacts 404, the first IPD component 200, the second IPD component 300, and the third IPD component 800 and/or the like. Additionally, inside the package 100, the first IPD component 200, the second IPD component 300, and the third IPD component 800 may be arranged on the support 102 via a die attach material 422 with the one or more interconnects 104 shown in an exemplary configuration that may connect between the package 100, the first IPD component 200, and/or the one or more semiconductor devices 400. The support 102 may dissipate the heat generated by the one or more semiconductor devices 400, the first IPD component 200, the second IPD component 300, and the third IPD component 800, while simultaneously isolating and protecting the one or more semiconductor devices 400 and the first IPD component 200, the second IPD component 300, and the third IPD component 800 from the outside environment. In aspects, the die attach material 422 may utilize an adhesive, soldering, sintering, eutectic bonding, thermal compression bonding, ultrasonic bonding/welding, a clip component, and/or the like as described herein.

The one or more interconnects 104 may utilize ball bonding, wedge bonding, compliant bonding, ribbon bonding, metal clip attach, and/or the like. In one aspect, the one or more interconnects 104 may utilize the same type of connection. In one aspect, the one or more interconnects 104 may utilize different types of connections.

The one or more interconnects 104 may be include various metal materials including one or more of aluminum, copper, silver, gold, and/or the like. In one aspect, the one or more interconnects 104 may utilize the same type of metal. In one aspect, the one or more interconnects 104 may utilize different types of metal. The one or more interconnects 104 may connect to the plurality of interconnect pads 206 by an adhesive, soldering, sintering, eutectic bonding, thermal compression bonding, ultrasonic bonding/welding, a clip component, and/or the like as described herein.

The support 102 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 102 may include an insulating material, a dielectric material, and/or the like.

Referring to FIG. 3, in one aspect, the first IPD component 200 may include an output PCB IPD implementation 292, the first IPD component 200 may include an input PCB IPD implementation 294, the second IPD component 300 may include an output IPD implementation 392, the second IPD component 300 may include an input IPD implementation 394, and the third IPD component 800 may include a baseband PCB IPD implementation. In one aspect, the output IPD implementation 392 may be implemented as a SiC IPD. In one aspect, the input IPD implementation 394 may be implemented as a SiC IPD. However, the first IPD component 200, the second IPD component 300, and the third IPD component 800 may be implemented for other functionality.

In one aspect, the second IPD component 300 may be configured to attach to the support 102. In one aspect, the second IPD component 300 may be configured to directly attach to the support 102. In this regard, attaching the second IPD component 300 to the support 102 may provide a thermal advantage over having SMD implementations of capacitors attached on a PCB-IPD.

Additionally, the first IPD component 200 may be configured to attach to the support 102. In one aspect, the first IPD component 200 may be configured to directly attach to the support 102.

As illustrated in FIG. 3, the second IPD component 300 may be arranged on either side of the first IPD component 200 on the support 102. In particular, the input IPD implementation 394 of the second IPD component 300 may be arranged on either side of the input PCB IPD implementation 294 of the first IPD component 200. Additionally, the output IPD implementation 392 of the second IPD component 300 may be arranged on either side of the output PCB IPD implementation 292 of the first IPD component 200.

In one aspect, the third IPD component 800 may be configured to attach to the support 102. In one aspect, the third IPD component 800 may be configured to directly attached to the support 102. As illustrated in FIG. 3, the third IPD component 800 may be arranged between the input IPD implementation 394 of the second IPD component 300 and the output IPD implementation 392 of the second IPD component 300.

Figure 14A:
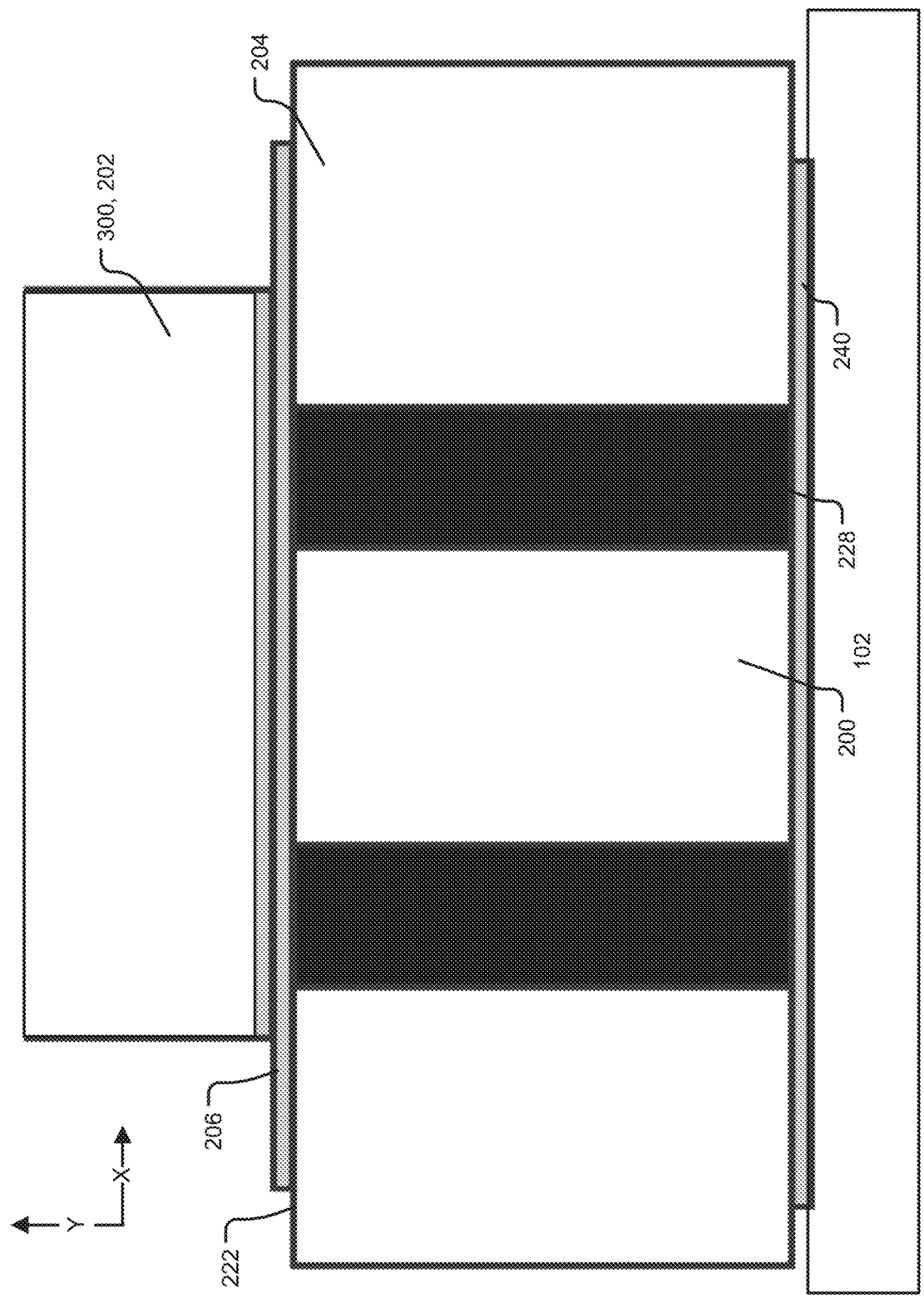
FIG. 14A and FIG. 14B illustrate side views of a IPD components according to the FIG. 13.
Figure 14B:
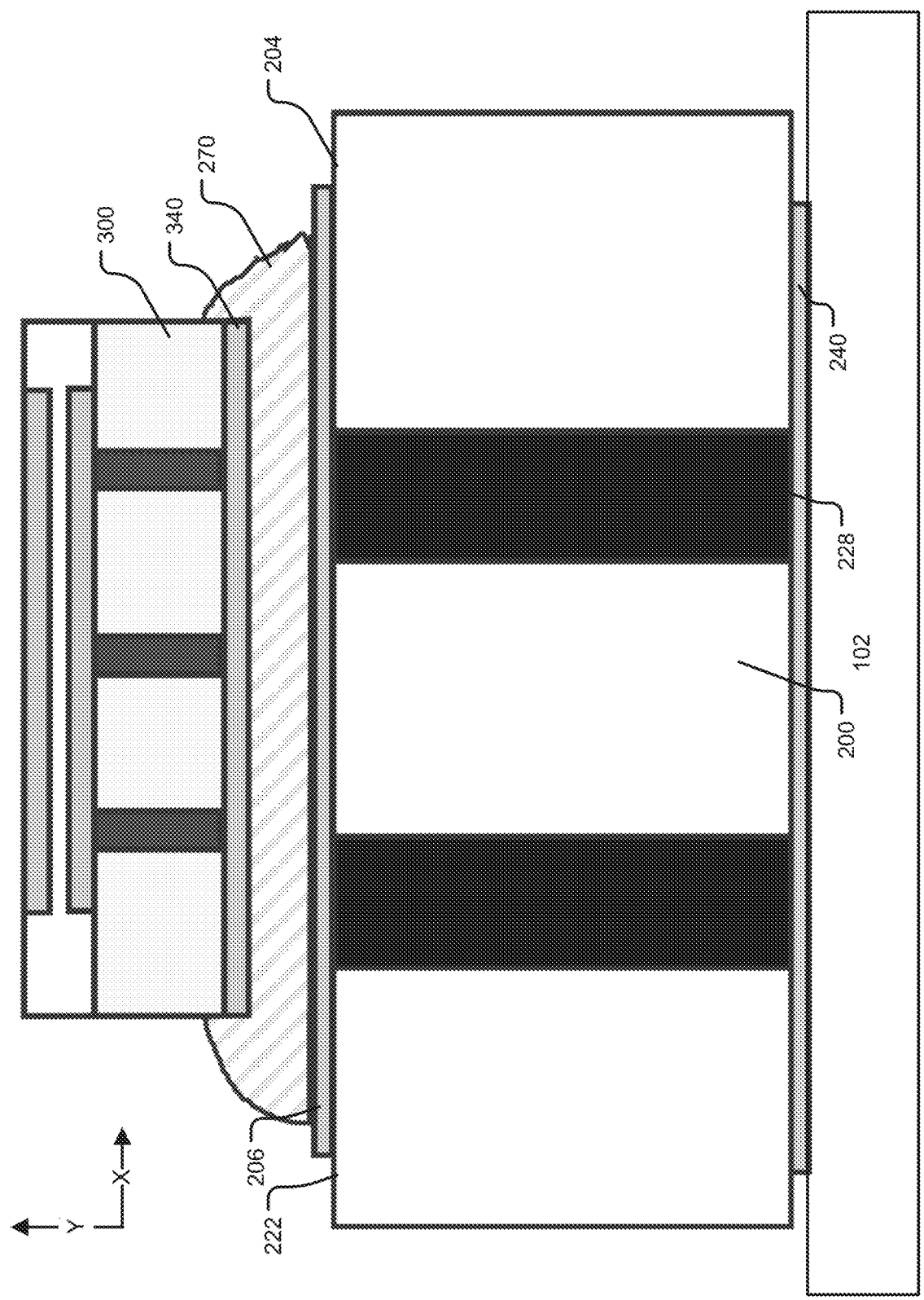

Referring to FIG. 4, the second IPD component 300 may be arranged on the first IPD component 200 as illustrated in FIG. 14A and FIG. 14B and described in association therewith. In one aspect, the second IPD component 300 may be directly arranged on the first IPD component 200. In particular, the second IPD component 300 may be arranged on an upper surface of and on either side of the first IPD component 200. More specifically, the input IPD implementation 394 of the second IPD component 300 may be arranged on an upper surface and on either side of the input PCB IPD implementation 294 of the first IPD component 200.

Additionally, the output IPD implementation 392 of the second IPD component 300 may be arranged on an upper surface of and on either side of the output PCB IPD implementation 292 of the first IPD component 200. Moreover, the first IPD component 200 may include electrical connections, such as via, to connect the first IPD component 200 to the support 102 and/or ground as illustrated in FIG. 14A and FIG. 14B and described in association therewith.

Figure 5:
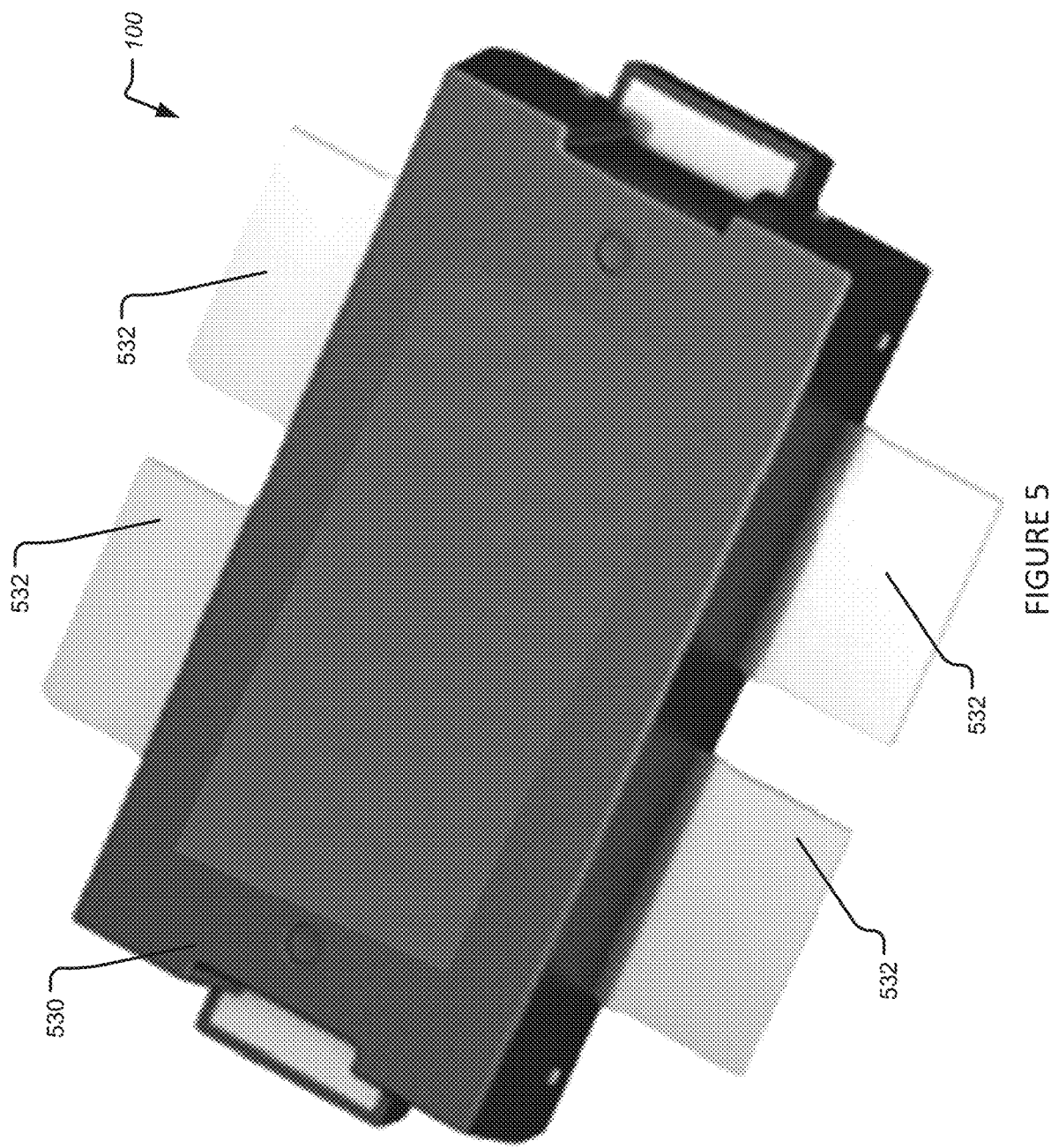
FIG. 5 illustrates a perspective view of a package according to the disclosure.

FIG. 5 illustrates a perspective view of a package according to the disclosure.

Figure 6:
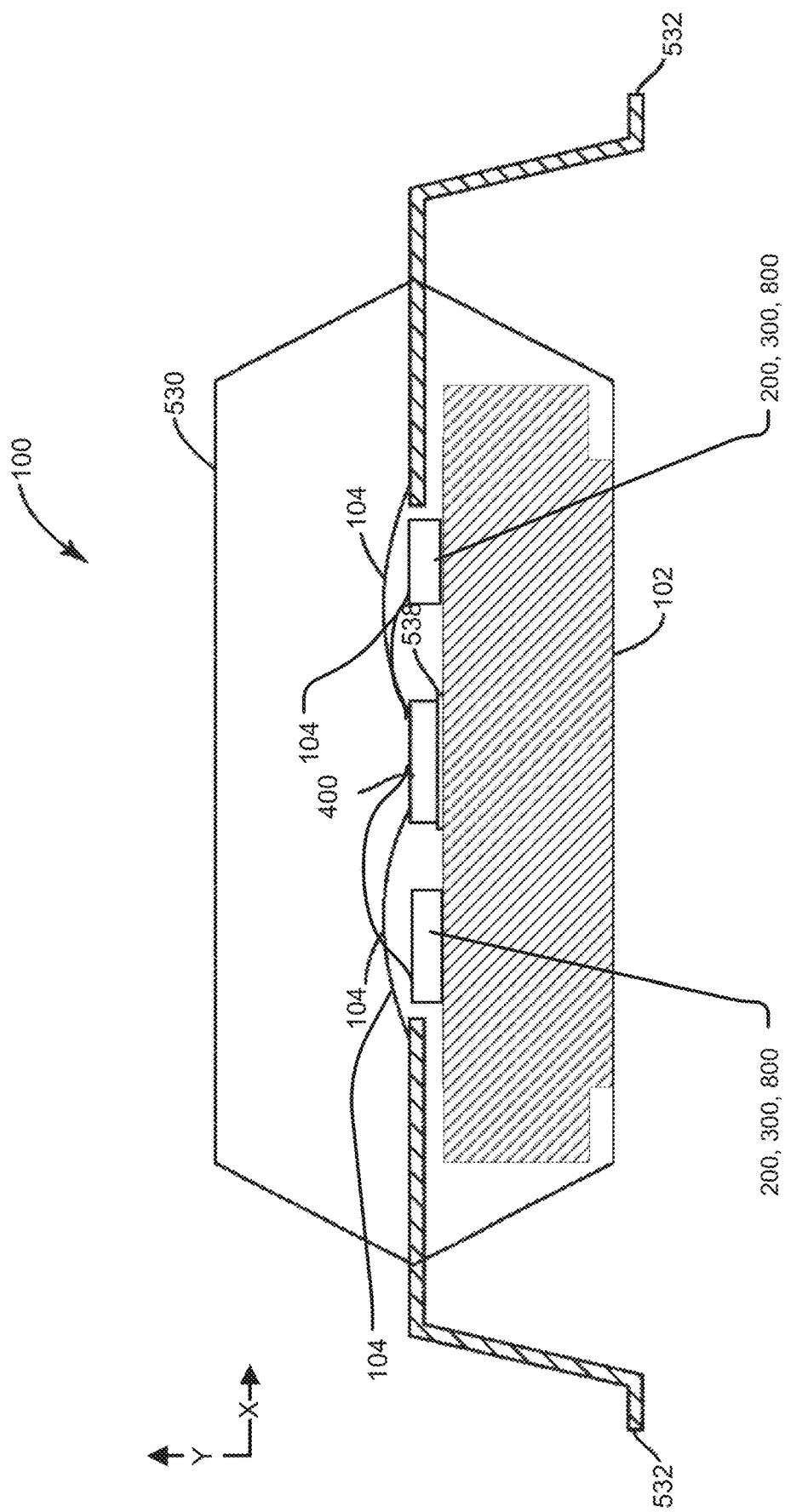
FIG. 6 illustrates a cross-sectional view of the package according to FIG. 5.

FIG. 6 illustrates a cross-sectional view of the package according to FIG. 5.

In particular, FIG. 5 and FIG. 6 show another exemplary implementation of the package 100 that may include any one or more other features, components, arrangements, and the like as described herein. In particular, FIG. 5 and FIG. 6 show the package 100 may be implemented as a RF package, a RF amplifier package, a RF power amplifier package, a RF power transistor package, a RF power amplifier transistor package, and/or the like as described herein. The package 100 may include the one or more semiconductor devices 400, the first IPD component 200, the second IPD component 300, the third IPD component 800, and/or the like. As further described herein, the first IPD component 200, the second IPD component 300, and the third IPD component 800 may be implemented with thermal conductivity, thermal management, and/or the like increasing efficiency, performance, and reliability.

Additionally, inside the package 100, the first IPD component 200 may be arranged on the support 102 as described herein with the one or more interconnects 104 shown in an exemplary configuration. Moreover, inside the package 100, the second IPD component 300 and the third IPD component 800 may be arranged on the support 102 and/or the first IPD component 200 as described herein with the one or more interconnects 104 shown in an exemplary configuration. The package 100 may include an over-mold 530, one or more input/output pins 532, and the support 102. The over-mold 530 may substantially surround the one or more semiconductor devices 400, which are mounted on the support 102 using a die attach material 538. The over-mold 530 may be formed of a plastic or a plastic polymer compound, which may be injection molded around the support 102, the one or more semiconductor devices 400, the first IPD component 200, the second IPD component 300, the third IPD component 800, and/or the like, thereby providing protection from the outside environment. The one or more semiconductor devices 400, the first IPD component 200, the second IPD component 300, and/or the third IPD component 800 may be coupled to the one or more input/output pins 532 via the one or more interconnects 104.

The one or more interconnects 104 may connect to a plurality of interconnect pads 206. The one or more interconnects 104 may be implemented as one or more wires, wire bonds, leads, vias, edge platings, circuit traces, tracks, clips, and/or the like. In one aspect, the one or more interconnects 104 may utilize the same type of connection. In one aspect, the one or more interconnects 104 may utilize different types of connections.

In one aspect, the over-mold configuration may substantially surround the one or more semiconductor devices 400, the first IPD component 200, the second IPD component 300, the third IPD component 800, and/or the like. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the one or more semiconductor devices 400, the first IPD component 200, the second IPD component 300, the third IPD component 800, and/or the like, thereby providing protection for the first IPD component 200, the one or more semiconductor devices 400, the second IPD component 300, the third IPD component 800, and other components of the package 100 from the outside environment.

Figure 7:
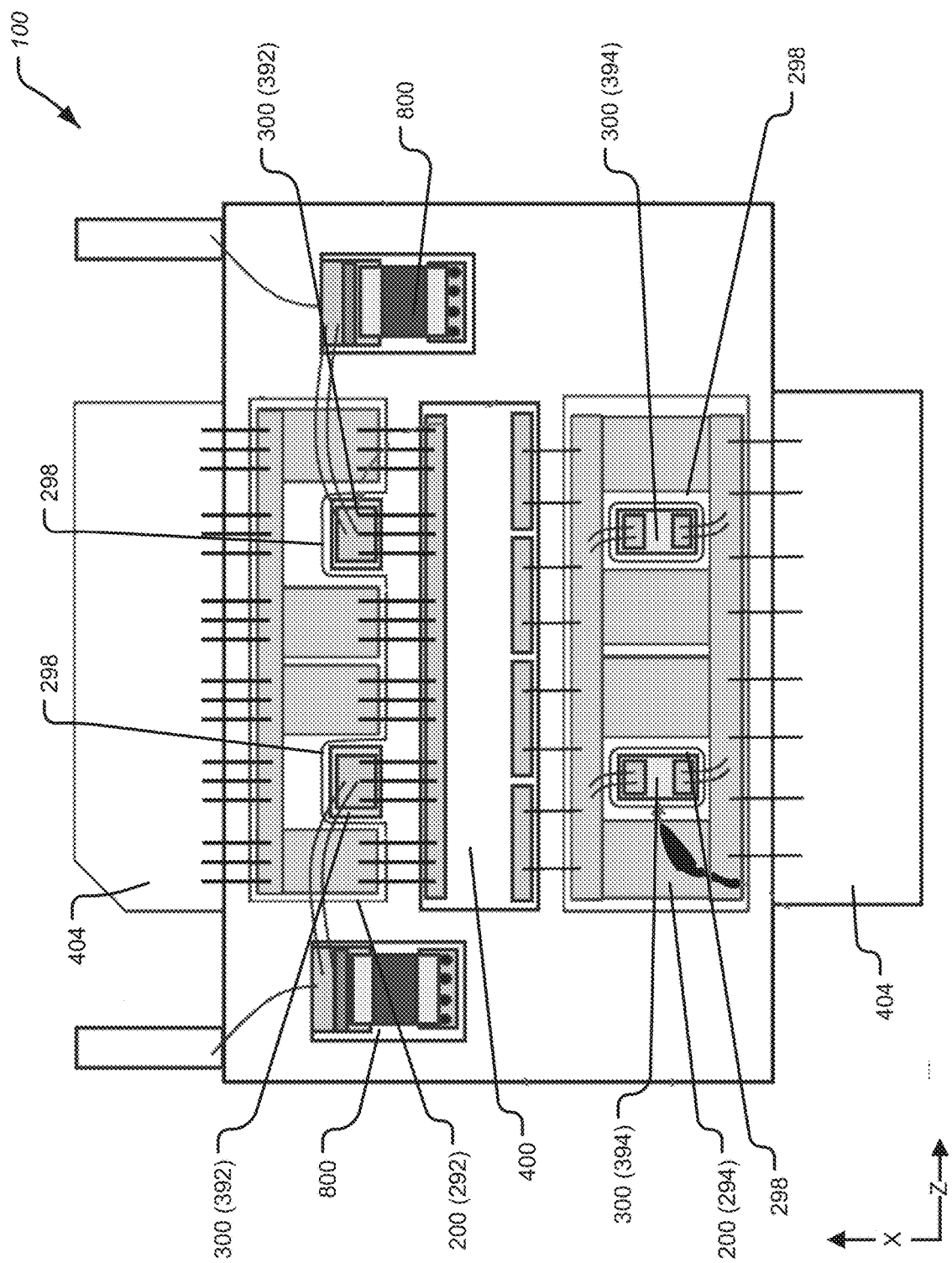
FIG. 7 illustrates a partial top view of the package according to another particular aspect of the disclosure.

FIG. 7 illustrates a partial top view of the package according to another particular aspect of the disclosure.

Figure 16:
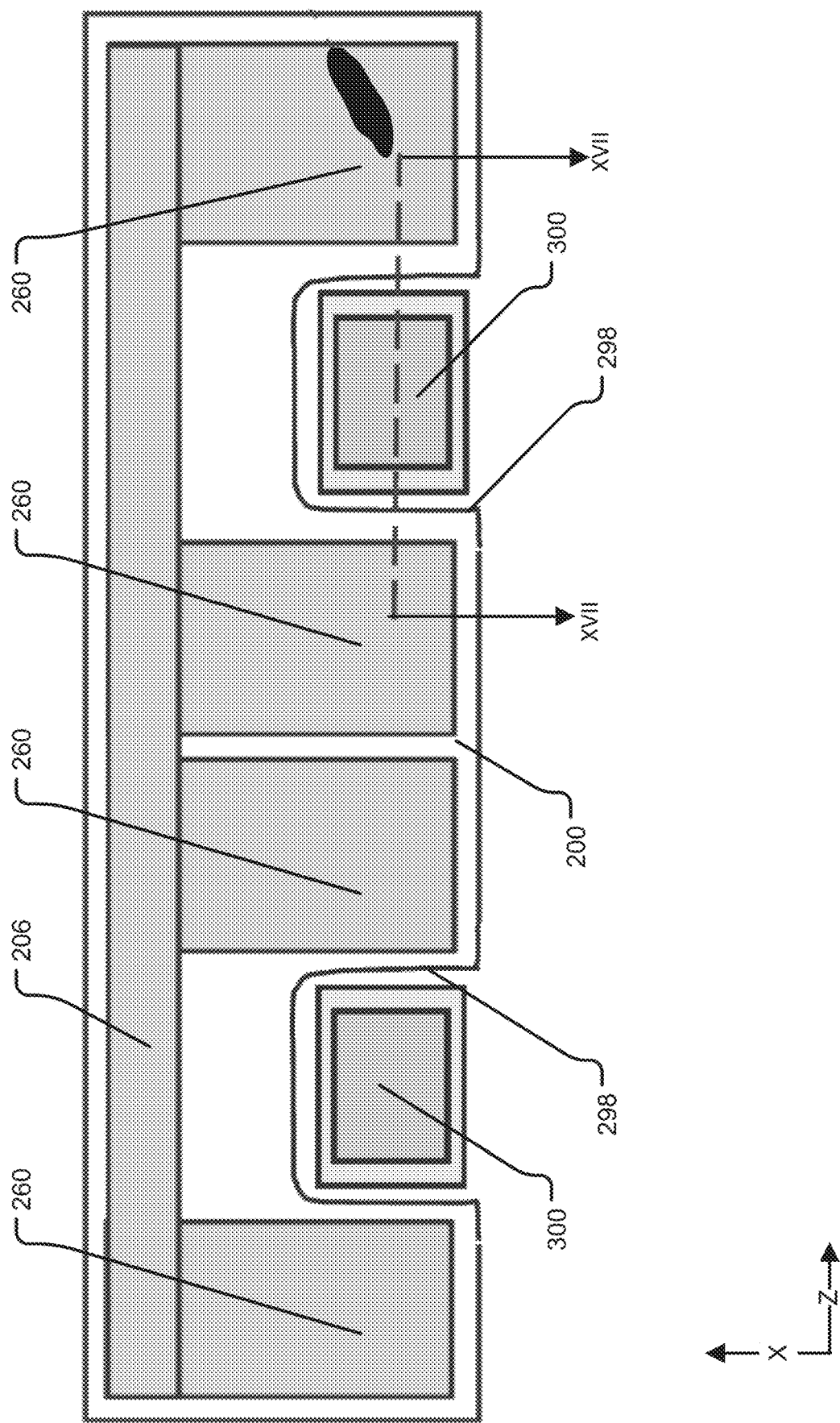
FIG. 16 illustrates a top view of IPD components according to the disclosure.

In particular, FIG. 7 shows another exemplary implementation of the package 100 that may include any one or more other features, components, arrangements, and the like as described herein. Referring to FIG. 7, the first IPD component 200 and the second IPD component 300 may be arranged on the support 102. Additionally, the first IPD component 200 may include one or more openings, holes, cutouts, and/or the like, hereinafter referred to as a cutout 298. In aspects, the second IPD component 300 may be arranged in the cutout 298, and/or the like of the first IPD component 200 as illustrated in FIG. 16 and described in association therewith.

Figure 8:
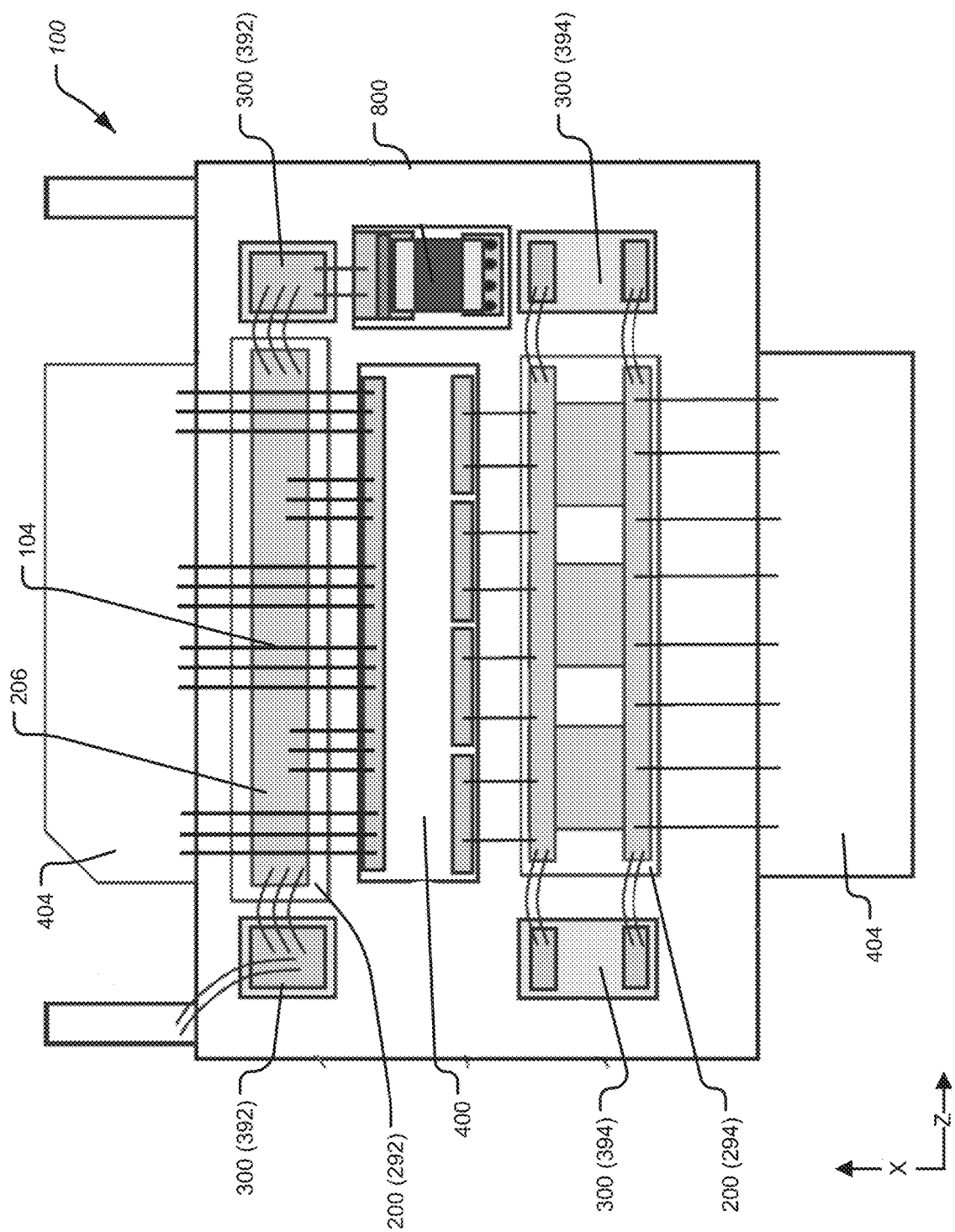
FIG. 8 illustrates a partial top view of the package according to another particular aspect of the disclosure.

FIG. 8 illustrates a partial top view of the package according to another particular aspect of the disclosure.

In particular, FIG. 8 shows another exemplary implementation of the package 100 that may include any one or more other features, components, arrangements, and the like as described herein. As shown in FIG. 8, the second IPD component 300 may be attached to the support 102. In one aspect, the second IPD component 300 may be directly attached to the support 102. Additionally, one or more implementations of the one or more interconnects 104 may be bonded directly from the one or more semiconductor devices 400 to the one or more metal contacts 404. In one aspect, one or more implementations of the one or more interconnects 104 may be bonded directly from a drain of the one or more semiconductor devices 400 to the one or more metal contacts 404.

With further reference to FIG. 8, the first IPD component 200 may be implemented with a continuous bar implementation of one of a plurality of interconnect pads 206. Moreover, the one or more interconnects 104 may be connected on the output PCB IPD implementation 292 of the first IPD component 200 and to the output IPD implementation 392 implementation of the second IPD component 300. In this regard, the implementation illustrated in FIG. 8 implements a beneficial configuration such that the one or more interconnects 104 may be shorter, that may result in less inductance; and resulting in shorter implementations of the one or more interconnects 104 for implementation of shunt tuning wires or series drain wires.

Figure 9:
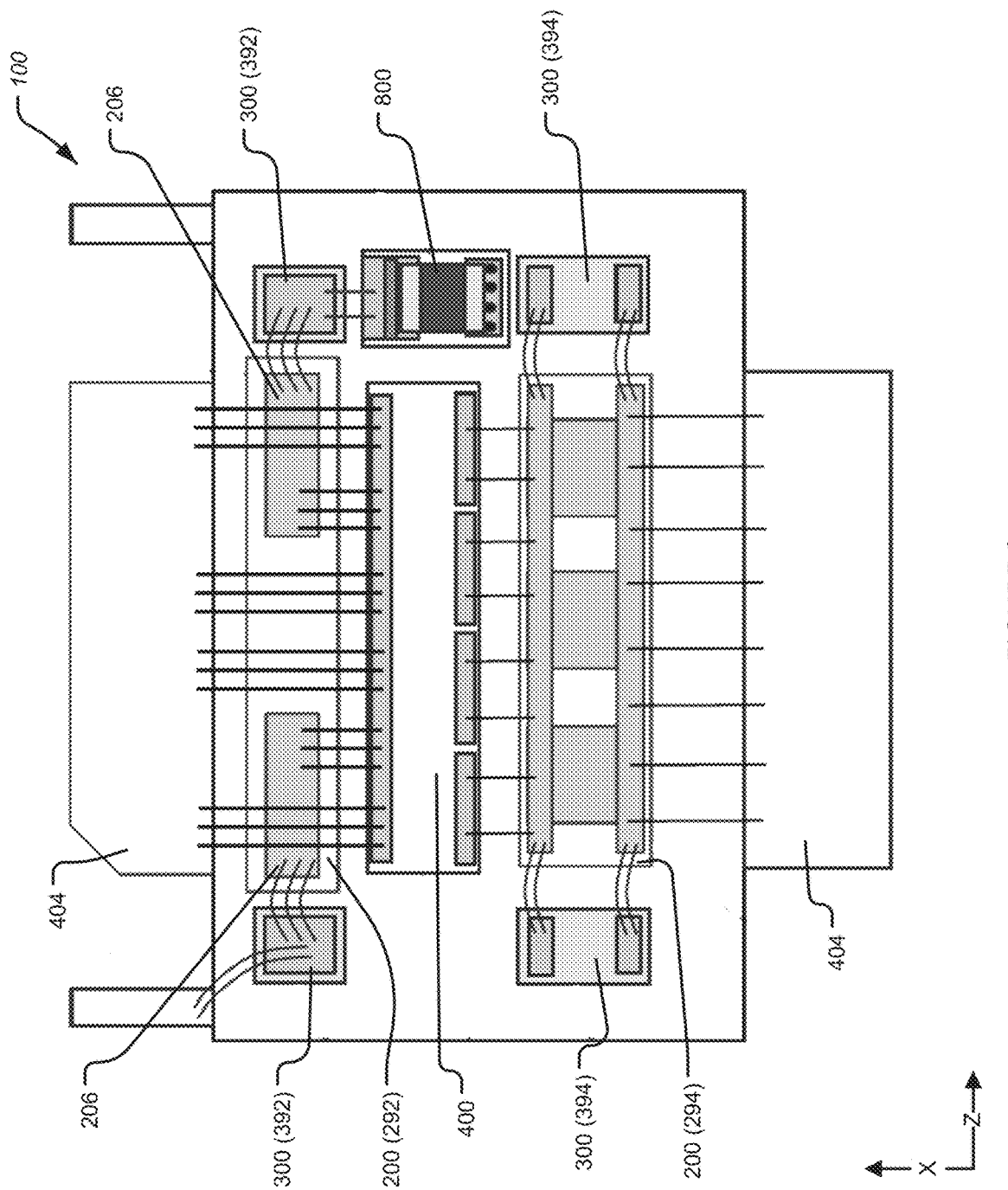
FIG. 9 illustrates a partial top view of the package according to another particular aspect of the disclosure.

FIG. 9 illustrates a partial top view of the package according to another particular aspect of the disclosure.

In particular, FIG. 9 shows another exemplary implementation of the package 100 that may include any one or more other features, components, arrangements, and the like as described herein. As illustrated in FIG. 9, an output bar implementation of the plurality of interconnect pads 206 on the output PCB IPD implementation 292 of the first IPD component 200 has been split into two segments. It is further contemplated that the output bar on the output PCB IPD implementation 292 of the first IPD component 200 may be split into any number of segments.

Figure 10:
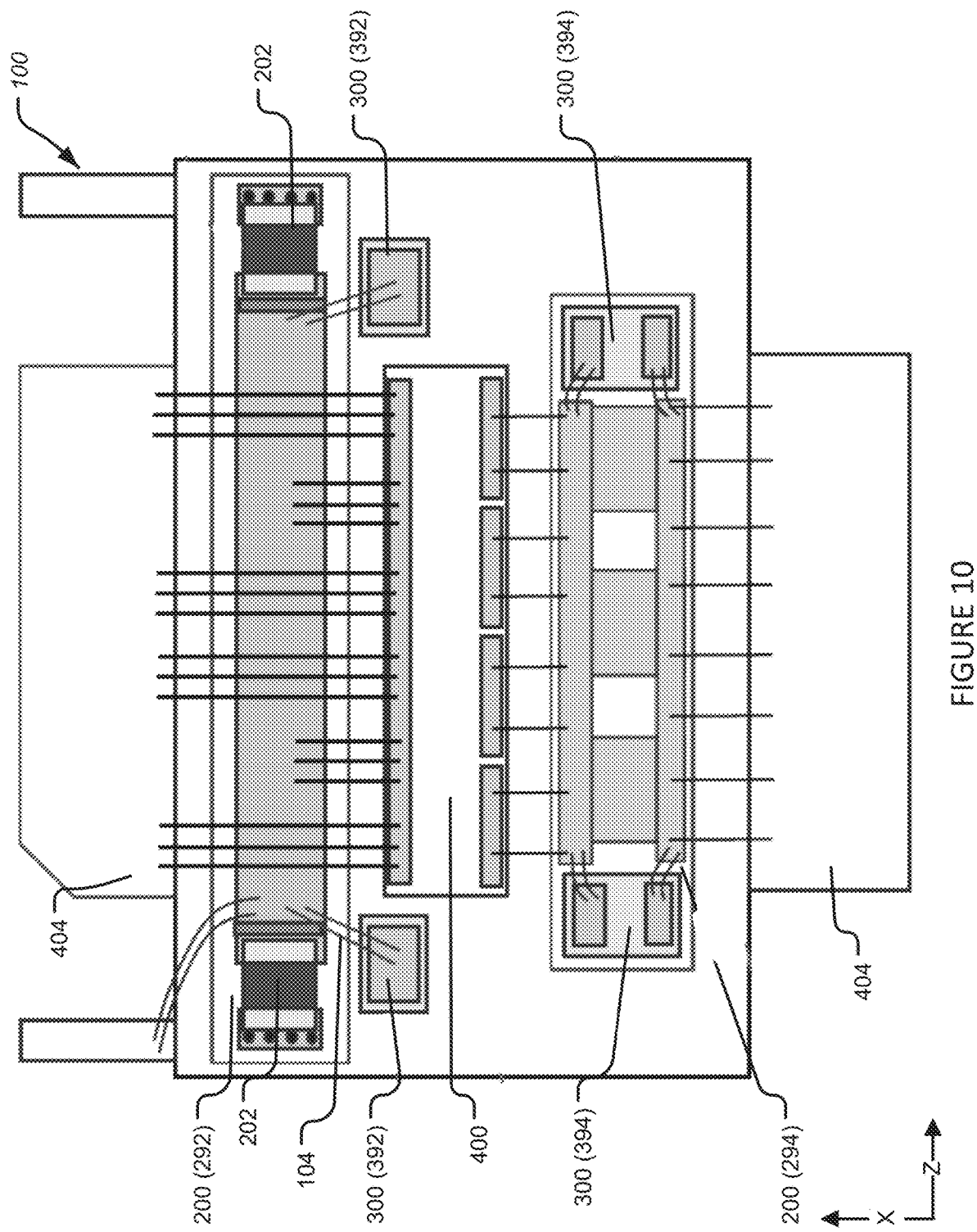
FIG. 10 illustrates a partial top view of the package according to another particular aspect of the disclosure.

FIG. 10 illustrates a partial top view of the package according to another particular aspect of the disclosure.

In particular, FIG. 10 shows another exemplary implementation of the package 100 that may include any one or more other features, components, arrangements, and the like as described herein. In particular, FIG. 10 illustrates that at least one device 202 may be arranged on the first IPD component 200. In one aspect, the at least one device 202 may be directly arranged on the first IPD component 200. In one aspect, the at least one device 202 may be arranged on the output PCB IPD implementation 292 of the first IPD component 200.

In one aspect, the at least one device 202 may be implemented as a base-band decoupling SMD capacitor that may be mounted on the output PCB IPD implementation 292 of the first IPD component 200. In one aspect, the at least one device 202 may be implemented as a base-band decoupling SMD capacitor that may be directly mounted the output PCB IPD implementation 292 of the first IPD component 200.

FIG. 10 further illustrates that the second IPD component 300 may connect to the output PCB IPD implementation 292 of the first IPD component 200 by one or more of the one or more interconnects 104. In one aspect, the second IPD component 300 may connect to the output PCB IPD implementation 292 of the first IPD component 200 by one or more of the one or more interconnects 104 implemented as wirebonds and may form a RF cold-spot at a landing point on the support 102. In this regard, the aspect of FIG. 10 may advantageously have wide video-bandwidth due to low inductance from the base-band cap (SMD) implementation of the at least one device 202 to the output PCB IPD implementation 292 of the first IPD component 200.

In other aspects, a separate implementation of a PCB with an SMD may be implemented and may be separate from the output PCB IPD implementation 292 of the first IPD component 200. For example, an implementation of the third IPD component 800 implementing the at least one device 202.

The at least one device 202 may be one or more of a surface mount device (SMD) component, a surface mount device (SMD) capacitor, a ceramic capacitor, a surface mount device (SMD) oscillator, a surface mount device (SMD) ceramic capacitor, an inductor, a surface mount device (SMD) inductor, a resistor, a surface mount device (SMD) resistor, a power divider, a surface mount device (SMD) power divider, a power splitter, a surface mount device (SMD) power splitter, an amplifier, a balanced amplifier, a surface mount device (SMD) amplifier, a surface mount device (SMD) balanced amplifier, a combiner, a surface mount device (SMD) combiner, and/or the like. The at least one device 202 may be implemented as a radio frequency device, a radio frequency circuit device, a radio frequency component device, or the like. The at least one device 202 may be implemented as a radio frequency device, a radio frequency circuit device, a radio frequency component device, or the like may be one or more of a surface mount device (SMD) radio frequency component, a surface mount device (SMD) radio frequency capacitor, a radio frequency ceramic capacitor, a surface mount device (SMD) oscillator, a surface mount device (SMD) radio frequency ceramic capacitor, a radio frequency inductor, a surface mount device (SMD) radio frequency inductor, a radio frequency resistor, a surface mount device (SMD) radio frequency resistor, a radio frequency power divider, a surface mount device (SMD) radio frequency power divider, a radio frequency power splitter, a surface mount device (SMD) radio frequency power splitter, a radio frequency amplifier, a balanced radio frequency amplifier, a surface mount device (SMD) radio frequency amplifier, a surface mount device (SMD) radio frequency balanced amplifier, a radio frequency combiner, a surface mount device (SMD) radio frequency combiner, a surface mount device (SMD) resistor, a surface mount device (SMD) resistor providing tuning, stability, and baseband impedance, and/or the like.

The package 100 may be implemented as an RF package and the at least one device 202 may be implemented as a radio frequency device that may include, connect, support, or the like a transmitter, transmitter functions, a receiver, receiver functions, a transceiver, transceiver functions, matching network functions, harmonic termination circuitry, integrated passive devices (IPD), and the like. The at least one device 202 implemented as a radio frequency device may be configured to, may support, or the like transmitting a radio wave and modulating that wave to carry data with allowable transmitter power output, harmonics, and/or band edge requirements. The at least one device 202 implemented as a radio frequency device may be configured to, may support, or the like receiving a radio wave and demodulating the radio wave. The at least one device 202 implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

Figure 11:
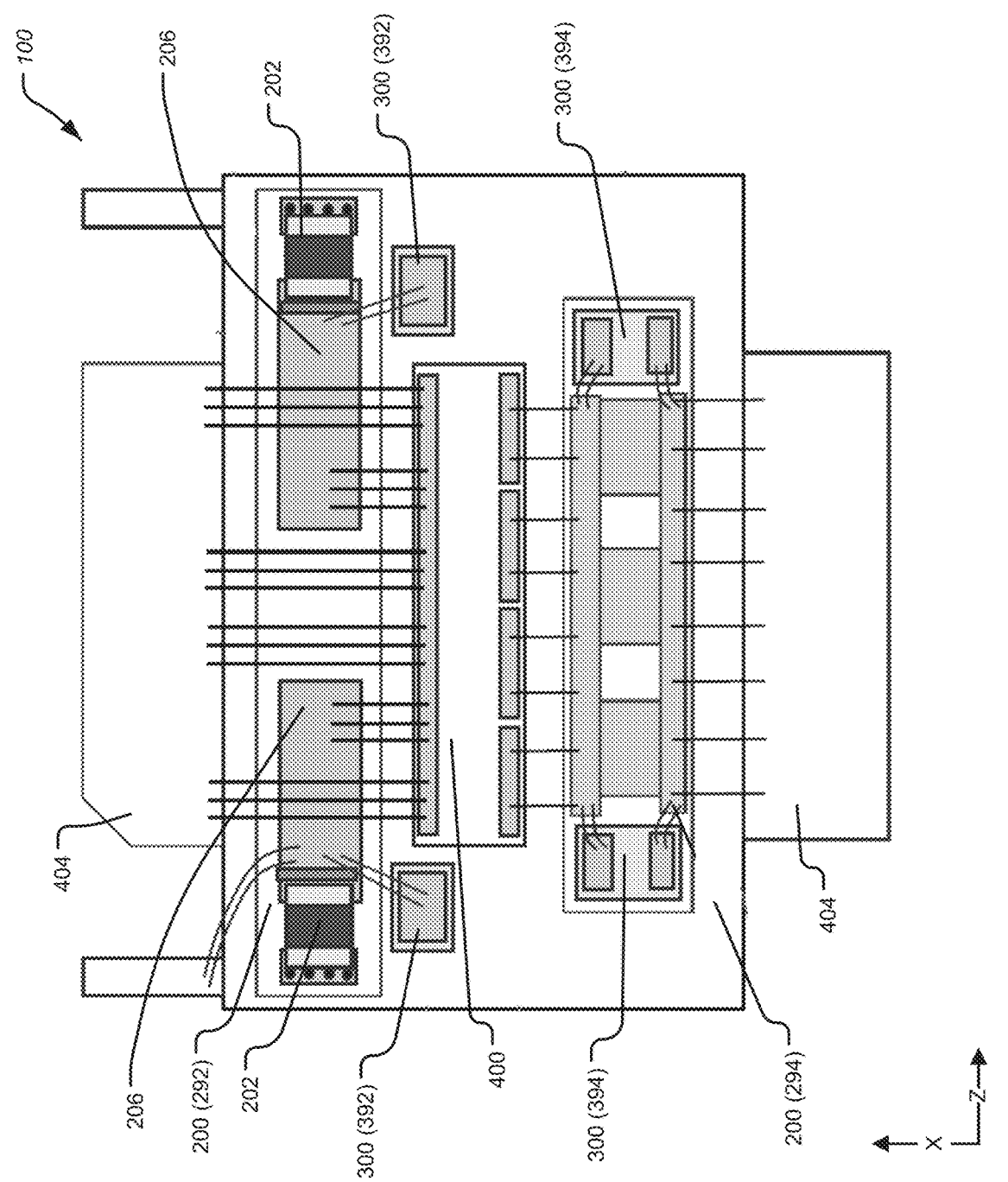
FIG. 11 illustrates a partial top view of the package according to another particular aspect of the disclosure.

FIG. 11 illustrates a partial top view of the package according to another particular aspect of the disclosure.

In particular, FIG. 11 shows another exemplary implementation of the package 100 that may include any one or more other features, components, arrangements, and the like as described herein. With reference to FIG. 11, this implementation may be similar to FIG. 10. Moreover, the conductive bar of the output PCB IPD implementation 292 of the first IPD component 200 may not be continuous. In particular, as illustrated in FIG. 11, an output bar implementation of the plurality of interconnect pads 206 on the output PCB IPD implementation 292 of the first IPD component 200 has been split into two segments. It is further contemplated that the output bar implementation of the plurality of interconnect pads 206 on the output PCB IPD implementation 292 of the first IPD component 200 may be split into any number of segments. In this regard, implementation of the package 100 as illustrated in FIG. 11 may address, reduce, and/or the like stability and odd-mode oscillation problems.

Figure 12:
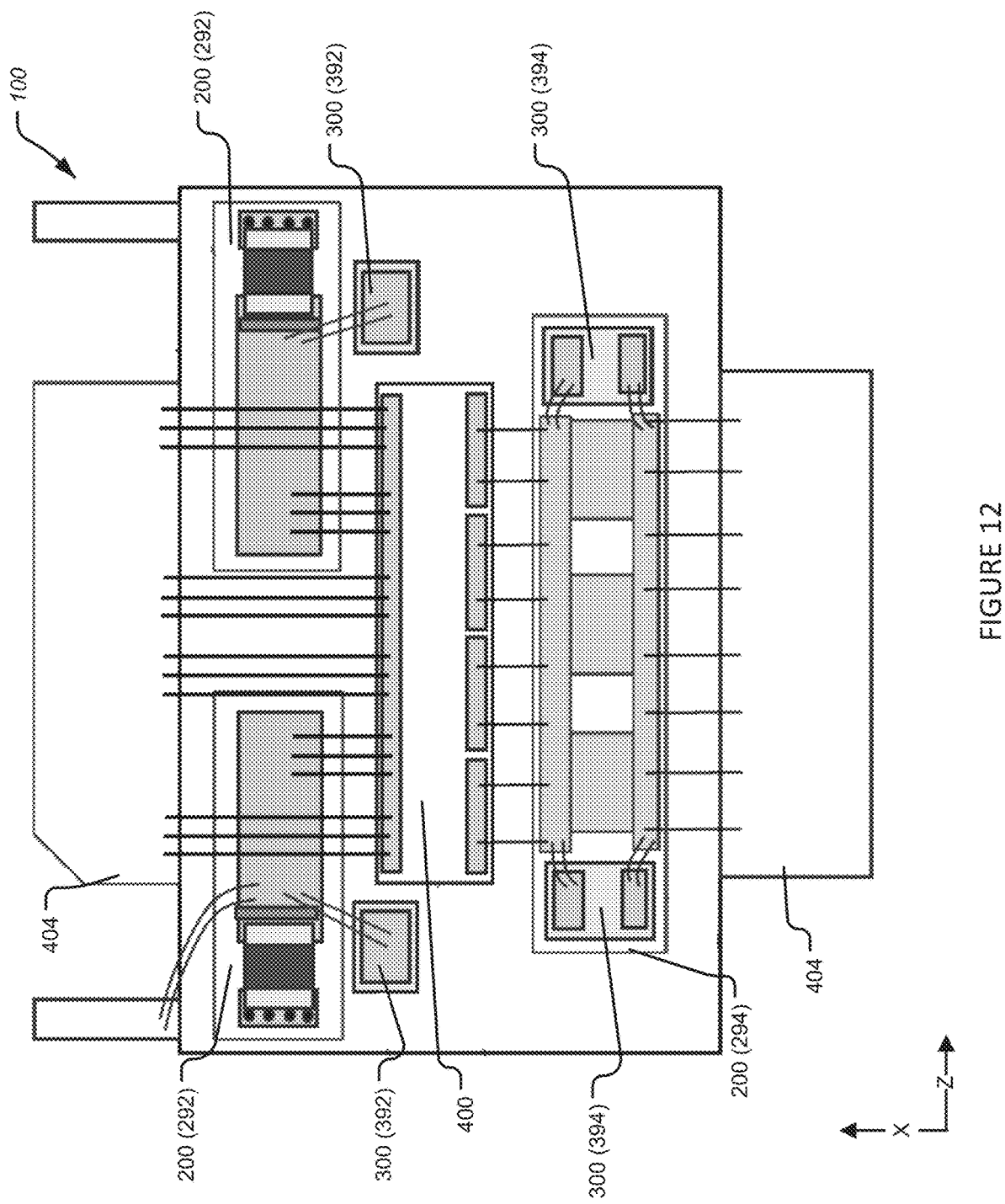
FIG. 12 illustrates a partial top view of the package according to another particular aspect of the disclosure.

FIG. 12 illustrates a partial top view of the package according to another particular aspect of the disclosure.

In particular, FIG. 12 shows another exemplary implementation of the package 100 that may include any one or more other features, components, arrangements, and the like as described herein. As illustrated in FIG. 12, the output PCB IPD implementation 292 of the first IPD component 200 has been split into two segments. It is further contemplated that the output PCB IPD implementation 292 of the first IPD component 200 may be split into any number of segments. Likewise, it is further contemplated that the input PCB IPD implementation 294 of the first IPD component 200 may be split into any number of segments.

Figure 13:
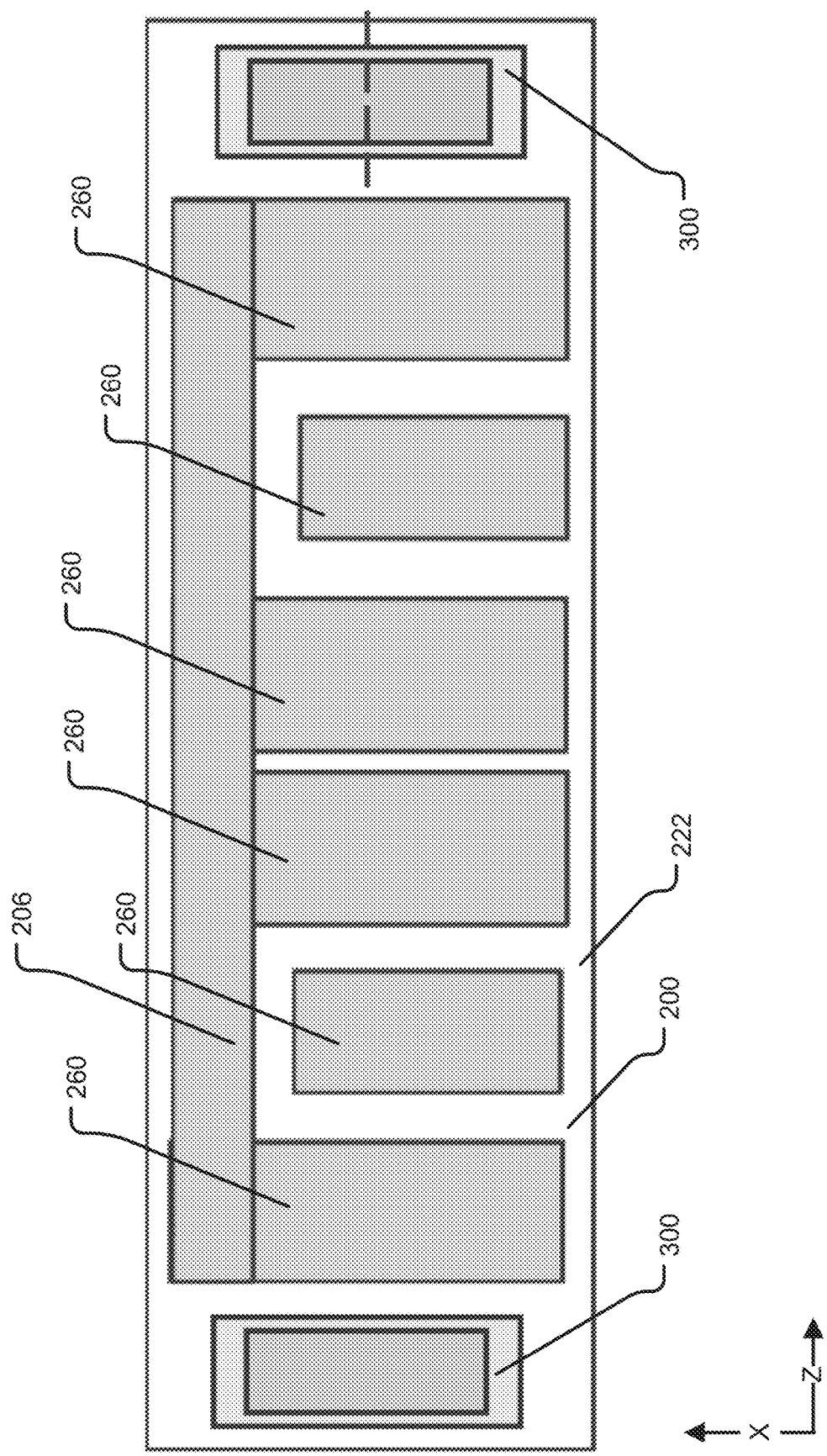
FIG. 13 illustrates a top view of IPD components according to the disclosure.

FIG. 13 illustrates a top view of IPD components according to the disclosure.

FIG. 14A and FIG. 14B illustrate side views of a IPD components according to the FIG. 13.

Figure 15:
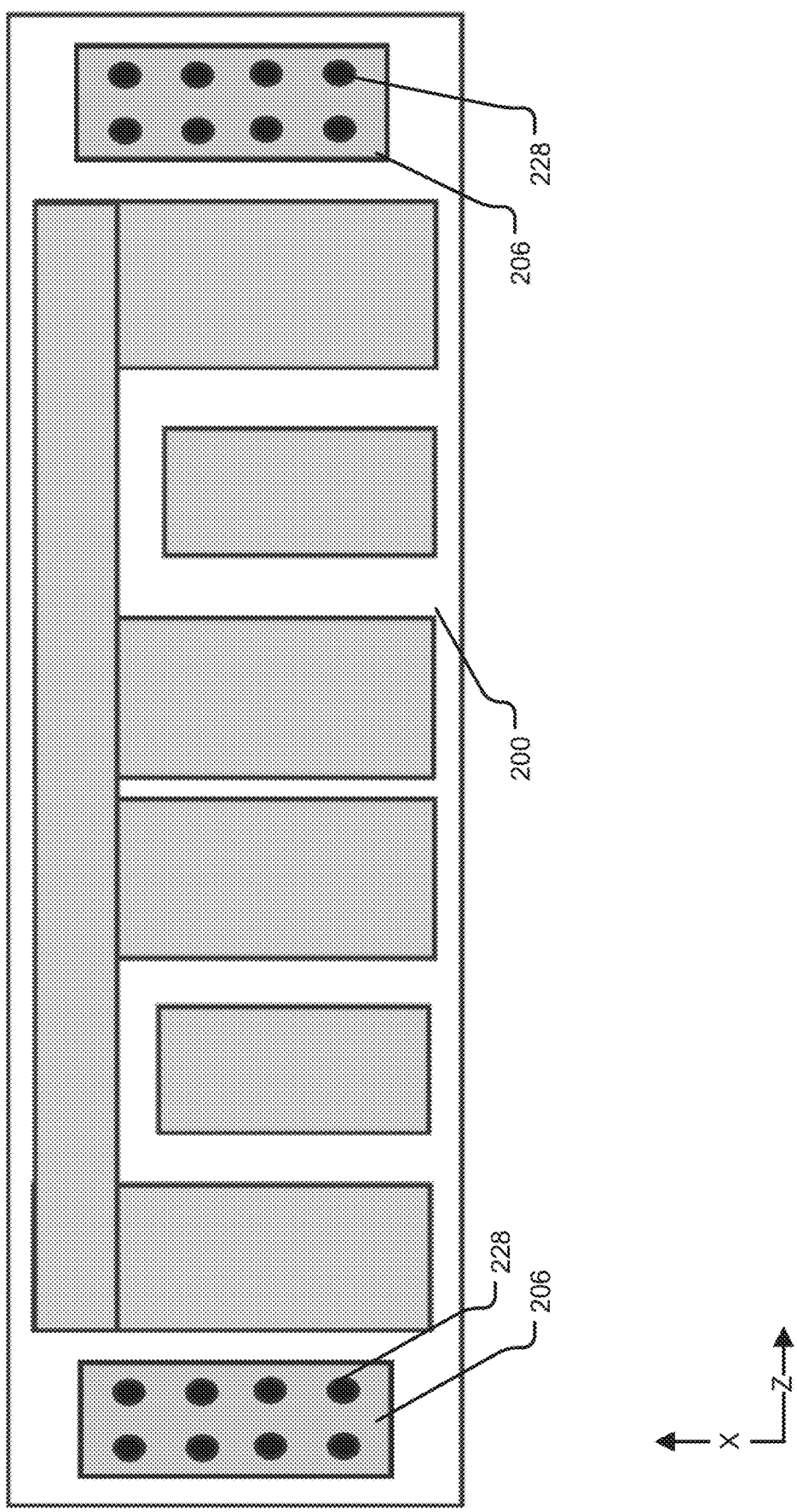
FIG. 15 illustrates a partial top view of IPD components according to FIG. 13.

FIG. 15 illustrates a partial top view of IPD components according to FIG. 13.

In particular, FIG. 13, FIG. 14A, FIG. 14B, and FIG. 15 illustrate exemplary implementations of the first IPD component 200 and the second IPD component 300 that may include any one or more other features, components, arrangements, and the like as described herein. As illustrated in FIG. 13, FIG. 14A, and FIG. 14B, the first IPD component 200 may be implemented with one or more implementations of the second IPD component 300 arranged thereon. In one aspect, the second IPD component 300 may be directly arranged on the first IPD component 200. With reference to FIG. 15, the first IPD component 200 is shown without the second IPD component 300 arranged thereon.

FIG. 13, FIG. 14A, FIG. 14B, and FIG. 15 further illustrate that the first IPD component 200 may include a plurality of interconnect pads 206 and one or more may be configured as an interconnect bond pad. With reference to FIG. 14A, the first IPD component 200 may include a substrate 204. In some aspects, the first IPD component 200 may include the second IPD component 300 as illustrated. With reference to FIG. 14B, the first IPD component 200 may include the second IPD component 300 arranged on the upper surface of the first IPD component 200. In particular, the first IPD component 200 may be connected to the second IPD component 300 by a connection portion 270. The connection portion 270 may electrically connect the second IPD component 300 to the first IPD component 200. In particular aspects, the connection portion 270 may electrically connect a metallization layer 340 of the second IPD component 300 to the plurality of interconnect pads 206 of the first IPD component 200. In aspects, the connection portion 270 may be a die attach material. The connection portion 270 may be an adhesive, soldering, sintering, eutectic bonding, ultrasonically welding, and/or the like as described herein. In one aspect, the connection portion 270 comprises solder. In one aspect, the connection portion 270 comprises an epoxy layer. In one aspect, the connection portion 270 comprises gold sinter. In aspects, a thickness of the connection portion 170 or die attach material (BLT— bond line thickness) may be configured, arranged, structured, and/or the like to exceed a minimum height in order to absorb any CTE (coefficient of thermal expansion) mismatch between the first IPD component 200, the second IPD component 300, and/or to the support 102.

The substrate 204 may be a printed circuit board (PCB) component, a ceramic component, a glass component, a low temperature co-fired ceramic (LTCC) component, a high temperature co-fired ceramic (HTCC) component, a thick film substrate component, and/or the like. In one or more aspects, the substrate 204 may include Teflon and/or hydrocarbon materials. In one or more aspects, the substrate 204 may include Teflon and/or hydrocarbon materials mixed with ceramic fillers. In one or more aspects, the substrate 204 may include Teflon and/or hydrocarbon materials mixed with ceramic fillers implemented as radio frequency (RF) materials.

With further reference to FIG. 14A, the substrate 204 may include an upper surface 222. The upper surface 222 may be located in a plane generally parallel to the x-axis or a plane generally parallel to the upper surface of the support 102. In this regard, generally may be defined to be within 0°-15°, 0°-2°, 2°-4°, 4°-6°, 6°-8°, 8°-10°, 10°-12°, or 12°-15°. The upper surface 222 may support the plurality of interconnect pads 206. The plurality of interconnect pads 206 may include multiple bond pad areas. The plurality of interconnect pads 206 may be formed by a metal surface on the upper surface 222 of the substrate 204 and may comprise a metallic material such as copper, gold, nickel, palladium, silver, and the like, and combinations thereof.

Additionally, the first IPD component 200 may include vias 228. The vias 228 may extend from the plurality of interconnect pads 206 to a metallization layer 240. Accordingly, a terminal of the second IPD component 300 may connect through the first connection to the first terminal bond pad through the vias 228 at least to the metallization layer 240 to make an electrical connection and/or electrical contact with the support 102. The vias 228 may also extend through the metallization layer 240 to the support 102 to make an electrical connection and/or electrical contact with the support 102. In other aspects, the vias 228 may only be implemented as partial vias. The vias 228 may be metallic plated holes or metallic filled holes that may function as electrical tunnels through the substrate 204. The vias 228 may comprise a metallic material such as copper, gold, nickel, palladium, silver, and the like, and combinations thereof. The vias 228 may have an axis that may be located in a plane generally perpendicular to the x-axis, a plane generally parallel to the x-axis, and/or a plane generally perpendicular to the upper surface 222.

The first IPD component 200 may include a metallization layer 240 located on a lower surface of the substrate 204 opposite the upper surface 222. The metallization layer 240 may be located in a plane generally parallel to the x-axis or a plane generally parallel to the upper surface 222. In one aspect, the metallization layer 240 may be implemented as a full face metallic layer on the lower surface of the substrate 204 opposite the upper surface 222. Additionally or alternatively, the first IPD component 200 may be single-sided having one metallic layer; the first IPD component 200 may be double-sided having two metallic layers on both sides of one substrate layer of the substrate 204; and/or the first IPD component 200 may be multi-layer having outer and inner layers of aluminum, copper, silver, gold, and/or the like, alternating with layers of substrate. The first IPD component 200 may include separate conducting lines, tracks, circuit traces, pads for connections, vias to pass connections between layers of aluminum, copper, silver, gold, and/or the like, and features such as solid conductive areas for EM shielding or other purposes. Additionally, the first IPD component 200 may include a circuit structure 260.

In some aspects, the first IPD component 200 may include the at least one device 202 as illustrated in FIG. 10. Accordingly, the disclosure utilizes the substrate 204 of the first IPD component 200 to support the at least one device 202.

The substrate 204 may be mounted on an upper surface of the support 102. The substrate 204 may be mounted on the upper surface of the support 102 by an adhesive, soldering, sintering, eutectic bonding, ultrasonically welding, and/or the like as described herein. In one aspect, the substrate 204 may be directly mounted on the upper surface of the support 102. In one aspect, the substrate 204 may be mounted on the upper surface of the support 102 with intervening structures, components, and/or the like. The upper surface of the support 102 may be parallel to an x-axis; and the substrate 204 may be arranged vertically above the support 102 along a y-axis. More specifically, the substrate 204 may at least partially insulate the at least one device 202 from the support 102.

The one or more of the plurality of interconnect pads 206 may be surfaces for bonding to the one or more interconnects 104. Accordingly, it may be beneficial to ensure that the surfaces of the plurality of interconnect pads 206 remain clean. In particular, attachment of the at least one device 202 to the plurality of interconnect pads 206 may result in solder transferring to other surfaces of the plurality of interconnect pads 206. Accordingly, the plurality of interconnect pads 206 may include a solder barrier arranged between various bond areas of the one or more interconnects 104 to the plurality of interconnect pads 206 and the bond areas of the at least one device 202 to the plurality of interconnect pads 206.

The upper surface 222 may further implement the plurality of interconnect pads 206 as a first terminal bond pad. The first terminal bond pad may be located in a plane generally parallel to the x-axis or a plane generally parallel to the upper surface 222. The first terminal bond pad may connect to a first terminal of the at least one device 202. In this regard, a first connection may be formed between the first terminal bond pad and the first terminal. The first connection may include an adhesive, soldering, sintering, eutectic bonding, ultrasonically welding, and/or the like as described herein. The first terminal bond pad may be formed by a metal surface on the upper surface 222 of the substrate 204 and may comprise a metallic material such as copper, gold, nickel, palladium, silver, and the like, and combinations thereof.

In some aspects, the at least one device 202 may include terminals arranged on a bottom surface. Accordingly, directly mounting a device such as the at least one device 202 to the support 102 of the package 100 would result in a short. For example, the at least one device 202 implemented as a surface mount device (SMD) component, such as a surface mount device (SMD) ceramic capacitor, may include one or more terminals arranged on a bottom surface of the surface mount device (SMD) component. Accordingly, mounting the at least one device 202 configured as a surface mount device (SMD) component to the support 102 of the package 100 would result in a short.

FIG. 16 illustrates a top view of IPD components according to the disclosure.

Figure 17A:
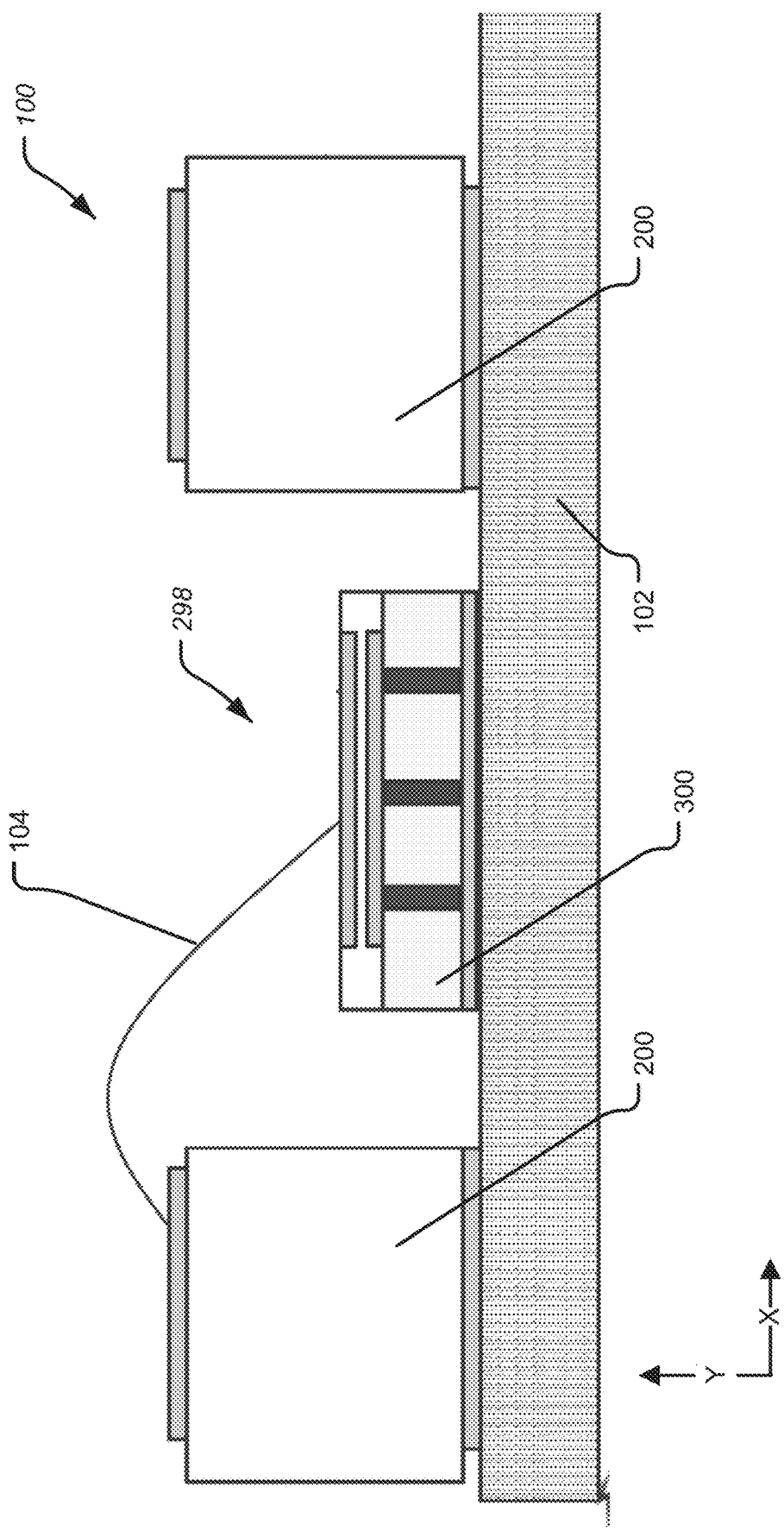
FIG. 17A and FIG. 17B illustrate side views of a IPD components according to the FIG. 16.
Figure 17B:
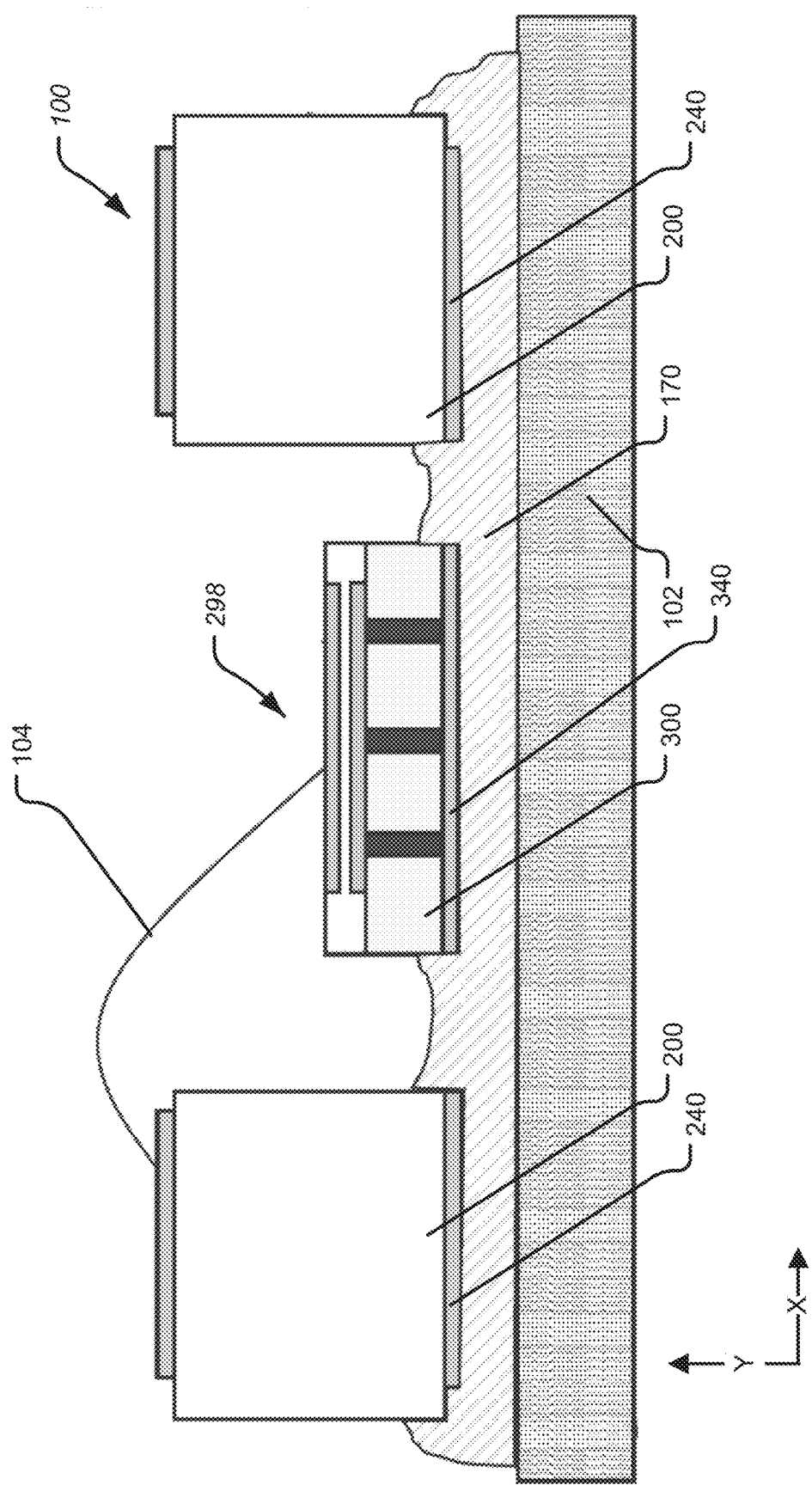

FIG. 17A and FIG. 17B illustrate side views of a IPD components according to the FIG. 16.

In particular, FIG. 16, FIG. 17A, and FIG. 17B illustrate exemplary implementations of the first IPD component 200 and the second IPD component 300 that may include any one or more other features, components, arrangements, and the like as described herein. As illustrated, the first IPD component 200 may include the cutout 298 that may be implemented as routed corners, holes, cutout pockets, and/or the like. With reference to FIG. 17B, the first IPD component 200 and the second IPD component 300 may be arranged on an upper surface of the support 102. In particular, the first IPD component 200 and/or the second IPD component 300 may be connected to the support 102 by a connection portion 170. The connection portion 170 may electrically connect the second IPD component 300 and/or the first IPD component 200 to the support 102. In particular aspects, the connection portion 170 may electrically connect the metallization layer 340 of the second IPD component 300 to the support 102. In particular aspects, the connection portion 170 may electrically connect the metallization layer 240 of the first IPD component 200 to the support 102. In aspects, the connection portion 170 may be a die attach material. The connection portion 170 may be an adhesive, soldering, sintering, eutectic bonding, ultrasonically welding, and/or the like as described herein. In one aspect, the connection portion 270 comprises solder. In one aspect, the connection portion 270 comprises an epoxy layer. In one aspect, the connection portion 270 comprises gold sinter. In aspects, a thickness of the connection portion 270 or die attach material (BLT—bond line thickness) may be configured, arranged, structured, and/or the like to exceed a minimum height in order to absorb any CTE (coefficient of thermal expansion) mis-match between the first IPD component 200, the second IPD component 300, and/or to the support 102.

In particular, the cutout 298 may be formed as a cutout of the first IPD component 200 and/or the substrate 204, a cutout area and/or portion of the first IPD component 200 and/or the substrate 204, an area where the first IPD component 200 and/or the substrate 204 has been modified, cut, sawn, routed, drilled, and/or the like. Accordingly, the first IPD component 200 may implement the cutout 298 to structurally form a shape that may be configured to increase efficient use of space within the package 100, as well as improve performance, reliability, and/or the like. In particular, the first IPD component 200 and the second IPD component 300 may fit together like a jigsaw puzzle to make for efficient use of space.

Arranged within the cutout 298 of the first IPD component 200 may be one or more implementations of the second IPD component 300. In one aspect, the first IPD component 200 and the second IPD component 300 may be directly mounted to the support 102. Additionally, the one or more interconnects 104 may connect between the first IPD component 200 and the second IPD component 300 as illustrated in FIG. 17.

Figure 18:
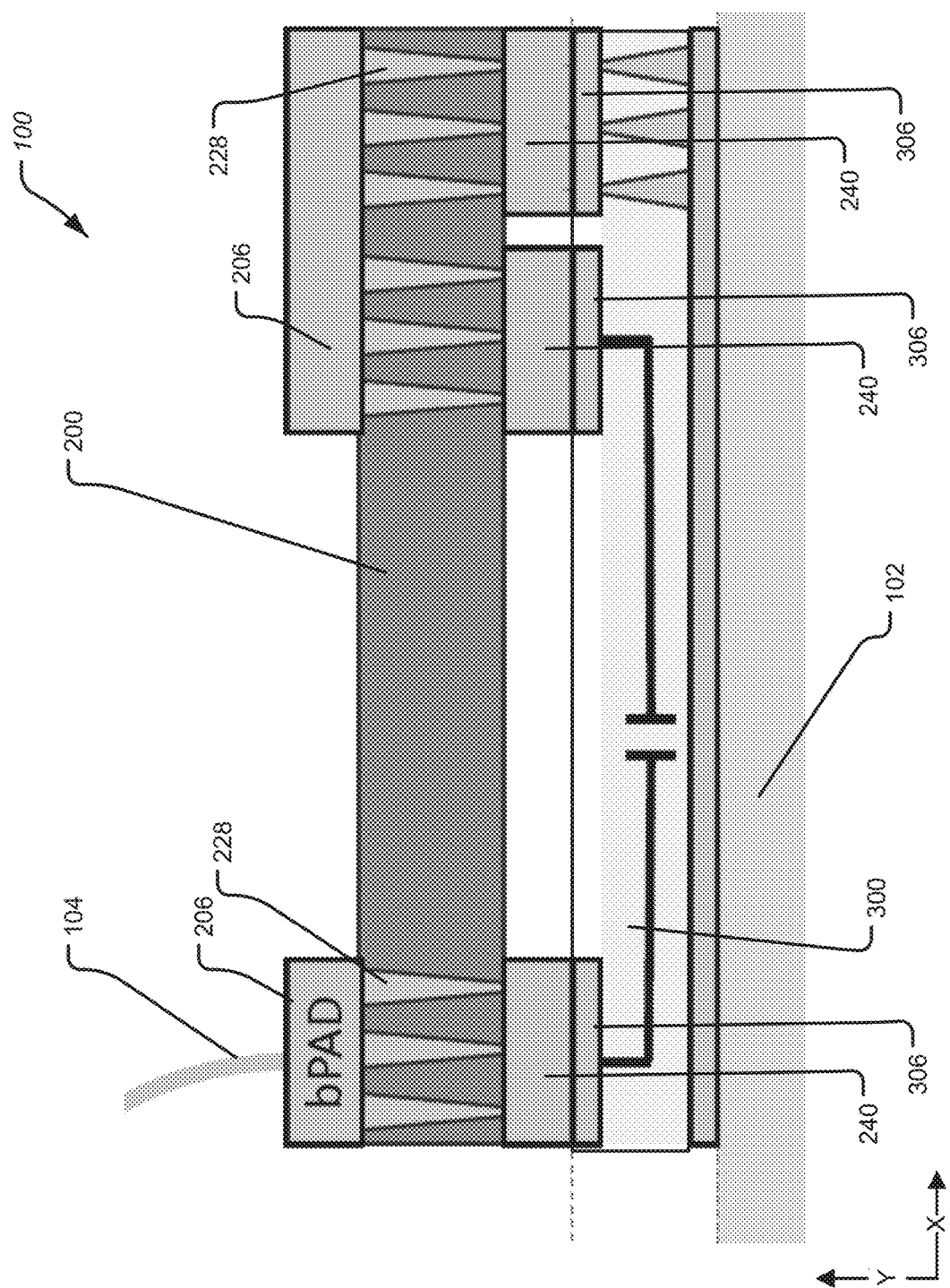
FIG. 18 illustrates a side view of a IPD components according to the disclosure.

FIG. 18 illustrates a side view of a IPD components according to the disclosure.

Figure 19:
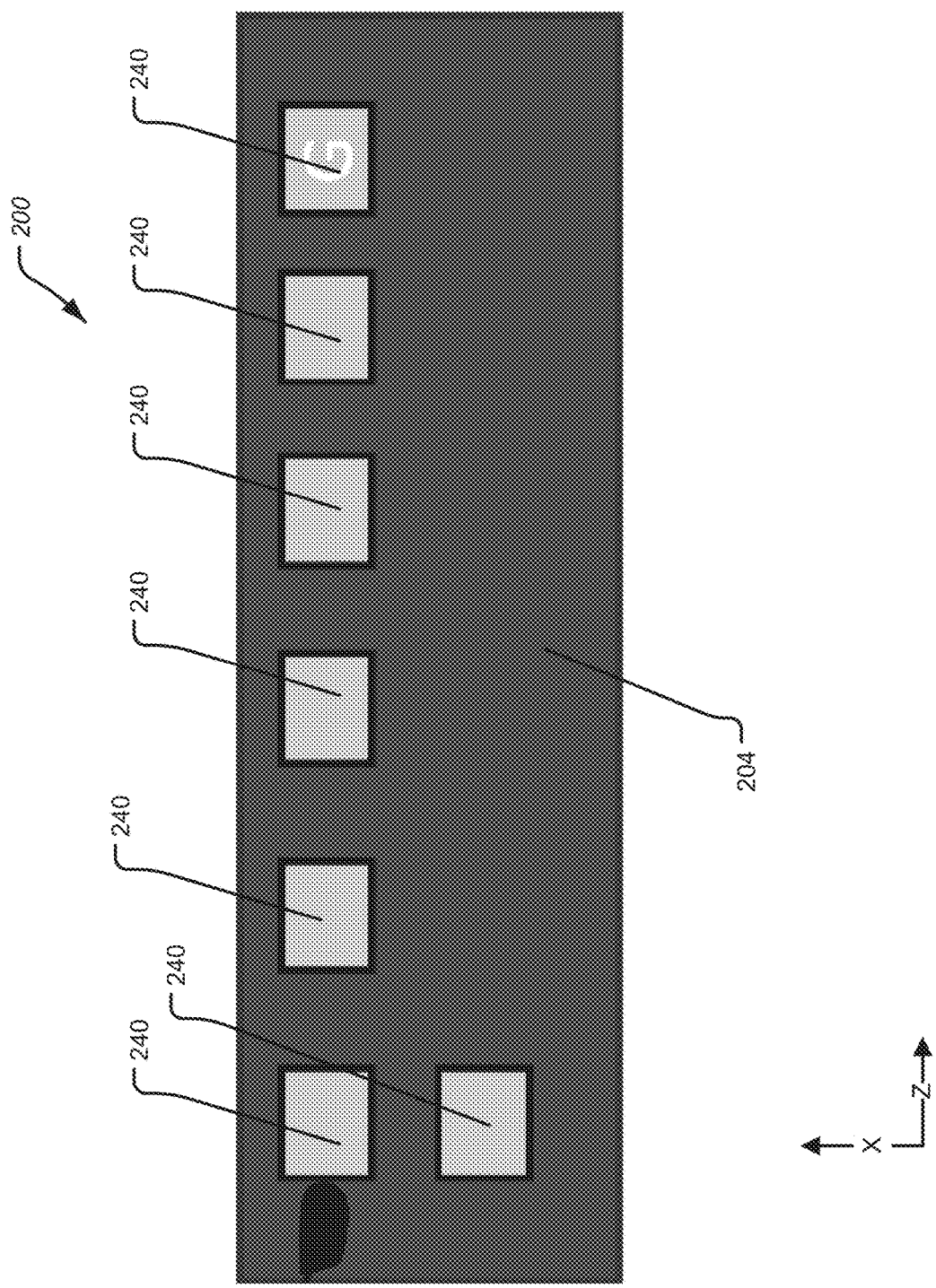
FIG. 19 illustrates a bottom view of a IPD components according to FIG. 18.

FIG. 19 illustrates a bottom view of a IPD components according to FIG. 18.

Figure 20:
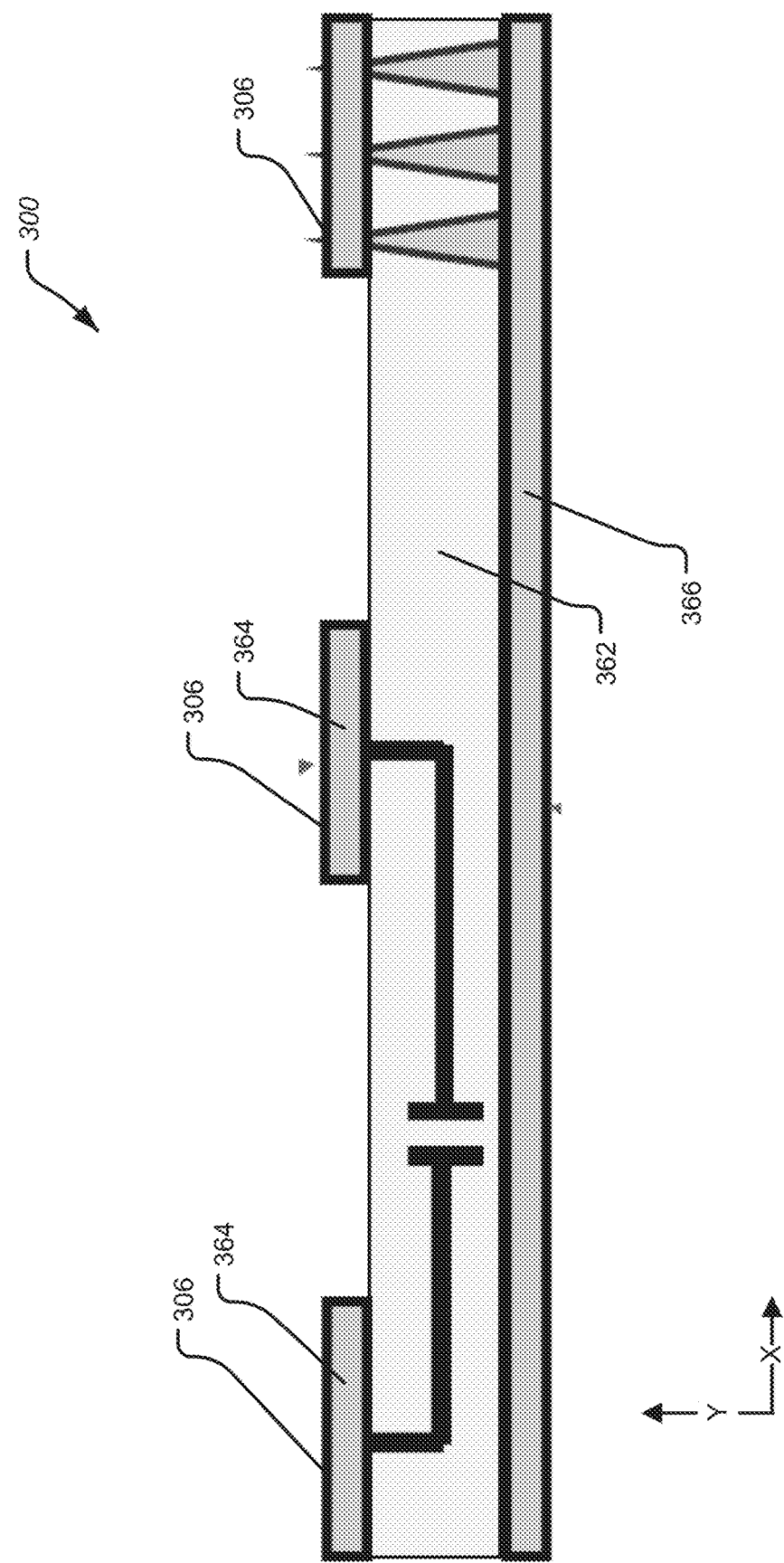
FIG. 20 illustrates a side view of a IPD components according to FIG. 18.

FIG. 20 illustrates a side view of a IPD components according to FIG. 18.

In particular, FIG. 18, FIG. 19, and FIG. 20 illustrate exemplary implementations of the first IPD component 200 and the second IPD component 300 that may include any one or more other features, components, arrangements, and the like as described herein. As illustrated, the second IPD component 300 may be attached to the support 102. In one aspect, the second IPD component 300 may be directly attached to the support 102. In one aspect, the first IPD component 200 may be arranged on the second IPD component 300. In one aspect the first IPD component 200 may be directly arranged on the second IPD component 300. Additionally, the first IPD component 200 may be electrically attached to the second IPD component 300.

The first IPD component 200 may include pads on a bottom surface that may be implemented by the metallization layer 240; and the second IPD component 300 may have pads on an upper surface that may be implemented by a plurality of interconnect pads 306. The pads of the first IPD component 200 and the pads of the second IPD component 300 may be matching pads. Accordingly, the first IPD component 200 may be attached to the second IPD component 300 by the matching pads. The attachment may include adhesive, soldering, sintering, eutectic bonding, ultrasonically welding, and/or the like as described herein. In aspects, the first IPD component 200 may include routing and interconnecting through one or multiple layers in the first IPD component 200.

Figure 21:
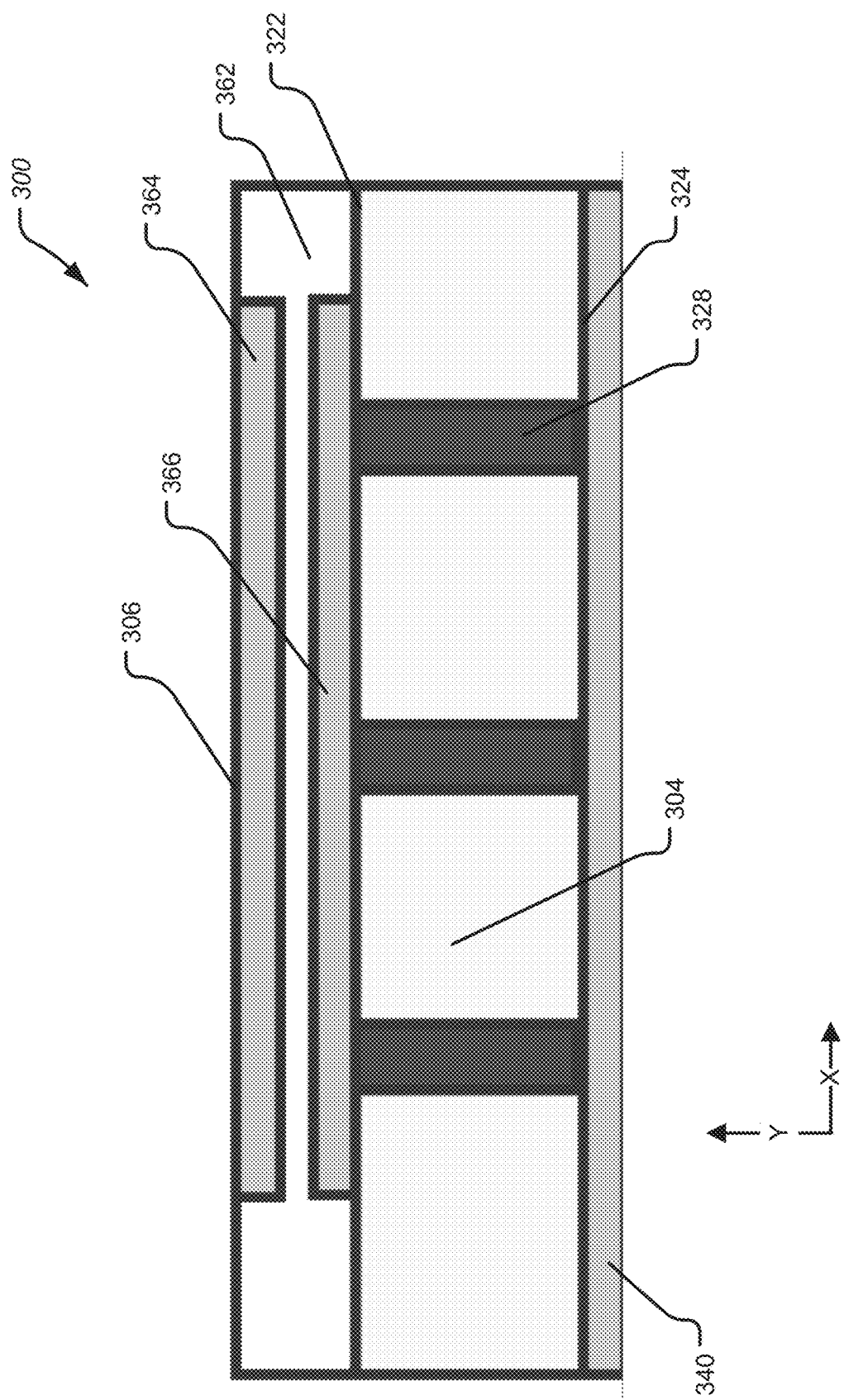
FIG. 21 illustrates a side view of a IPD components according to the disclosure.

FIG. 21 illustrates a side view of a IPD components according to the disclosure.

In particular, FIG. 21 illustrates exemplary implementations of the second IPD component 300 that may include any one or more other features, components, arrangements, and the like as described herein. The second IPD component 300 may include a substrate 304, a dielectric layer 362, a top metal 364, a bottom metal 366, a metallization layer 340, and/or the like. In particular, the second IPD component 300 may form a capacitor with the top metal 364 and the bottom metal 366 having the dielectric layer 362 therebetween.

The top metal 364 may be arranged parallel to the x-axis as illustrated, the top metal 364 may be continuous and arranged parallel the bottom metal 366. Moreover, the top metal 364 may be arranged vertically above the bottom metal 366 along the y-axis as illustrated.

The substrate 304 may include silicon carbide (SiC). The substrate 304 may be made of Silicon Carbide (SiC). In some aspects, the substrate 304 may be a semi-insulating SiC substrate, a p-type substrate, an n-type substrate, and/or the like. In some aspects, the substrate 304 may be very lightly doped. In one aspect, the substrate 304 may be formed of SiC selected from the group of 6H, 4H, 15R, 3C SiC, or the like. In one aspect, the substrate 304 may be formed of SiC that may be semi-insulating and doped with vanadium or any other suitable dopant or undoped of high purity with defects providing the semi-insulating properties. In other aspects, the substrate 304 may include silicon, Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material. The substrate 304 may include an upper surface 322. The upper surface 322 may support the bottom metal 366.

The bottom metal 366 may be arranged on the upper surface 322 of the substrate 304. In particular, there may be one or more intervening layers or structures between the upper surface 322 of the substrate 304 and the bottom metal 366 (not shown).

The bottom metal 366 may be formed as a metal surface on the upper surface 322 of the substrate 304 and may comprise a metallic material such as copper, gold, nickel, palladium, silver, tin, a gold tin alloy, and the like, and combinations thereof. In one aspect, the bottom metal 366 may have a thickness along the y-axis of 0.1 microns to 0.6 microns, 0.1 microns to 0.2 microns, 0.2 microns to 0.3 microns, 0.3 microns to 0.4 microns, 0.4 microns to 0.5 microns, or 0.5 microns to 0.6 microns.

The dielectric layer 362 may be arranged on the bottom metal 366 and/or the substrate 304. In particular, there may be one or more intervening layers or structures between the dielectric layer 362 and the bottom metal 366 (not shown). In other aspects, the dielectric layer 362 may be directly arranged on the bottom metal 366. In one aspect, the dielectric layer 362 may be continuous. The dielectric layer 362 may include SiN, AlO, SiO, $SiO_2$, AlN, or the like or combinations thereof together with other intervening layers. The dielectric layer 362 may have any thickness along a y-axis to provide the desired capacitance density, capacitance, standoff voltage, and/or the like. In some aspects, the dielectric layer 362 may have a thickness along the y-axis of 100 Å to 11000 Å, 100 Å to 1000 Å, 1000 Å to 2000 Å, 2000 Å to 3000 Å, 3000 Å to 4000 Å, 4000 Å to 5000 Å, 5000 Å to 6000 Å, 6000 Å to 7000 Å, 7000 Å to 8000 Å, 8000 Å to 9000 Å, 9000 Å to 10000 Å, or 10000 Å to 11000 Å. In some aspects, the dielectric layer 362 may have a thickness along the y-axis of greater than 10000 Å.

The top metal 364 may be arranged on the dielectric layer 362. In particular, there may be one or more intervening layers or structures between the top metal 364 and the dielectric layer 362 (not shown). In other aspects, the top metal 364 may be directly arranged on the dielectric layer 362. The top metal 364 may be formed as a metal surface on an upper surface the dielectric layer 362 and may comprise a metallic material such as copper, gold, nickel, palladium, silver, tin, a gold tin alloy, and the like, and combinations thereof. In some aspects, the top metal 364 may comprise stacked layers. In one aspect, the top metal 364 may have a thickness along the y-axis of 0.1 microns to 7 microns, 0.1 microns to 0.2 microns, 0.2 microns to 0.3 microns, 0.3 microns to 0.4 microns, 0.4 microns to 0.5 microns, 0.5 microns to 0.6 microns, 0.6 microns to 0.7 microns, 0.7 microns to 1 microns, 1 microns to 2 microns, 2 microns to 3 microns, 3 microns to 4 microns, 4 microns to 5 microns, 5 microns to 6 microns, or 6 microns to 7 microns.

The substrate 304 may include a lower surface 324. The second IPD component 300 may include the metallization layer 340 located on the lower surface 324 of the substrate 304 opposite the upper surface 322. The metallization layer 340 may be located in a plane generally parallel to the x-axis or a plane generally parallel to the upper surface 322. The metallization layer 340 may comprise a metallic material such as copper, gold, nickel, palladium, silver, tin, a gold tin alloy, and the like, and combinations thereof. In one aspect, the metallization layer 340 may have a thickness along the y-axis of 1 microns to 9 microns, 1 microns to 2 microns, 2 microns to 3 microns, 3 microns to 4 microns, 4 microns to 5 microns, 5 microns to 6 microns, 6 microns to 7 microns, 7 microns to 8 microns, or 8 microns to 9 microns.

Additionally, the second IPD component 300 may include an electrical connection such as vias 328. However, any type of electrical connection is contemplated. In particular aspects, the substrate 304 of the second IPD component 300 may include the vias 328 extending along the y-axis through the substrate 304. One or more of the vias 328 may be electrically connected to the metallization layer 340. Additionally, the one or more of the vias 328 may be electrically connected to the bottom metal 366.

The vias 328 may be metallic plated holes or metallic filled holes that may function as electrical tunnels through the substrate 304. The vias 328 may comprise a metallic material such as copper, gold, nickel, palladium, silver, tin, a gold tin alloy, and the like, and combinations thereof. The vias 328 may have an axis that may be located in a plane generally perpendicular to the x-axis, a plane generally parallel to the x-axis, and/or a plane generally perpendicular to the upper surface 322.

The metallization layer 340 may form a first connection, node, and/or port for the second IPD component 300; and the top metal 364 and/or the plurality of interconnect pads 306 may form a second connection, node, and/or port for the second IPD component 300.

An upper surface 322 of the top metal 364 may support a plurality of interconnect pads 306. The plurality of interconnect pads 306 may include multiple bond pad areas. The plurality of interconnect pads 306 may be formed by a metal surface on the dielectric layer 362 and/or the top metal 364 and may comprise a metallic material such as copper, gold, nickel, palladium, silver, and the like, and combinations thereof.

Accordingly, the second IPD component 300 may form a capacitor. The capacitance of the capacitor may then be defined by the area of the bottom metal 366, the top metal 364, and the thickness and dielectric constant of the dielectric layer 362, and may have an independent and isolated region on a backside of the substrate 304 for electrical connection by the metallization layer 340.

Figure 22:
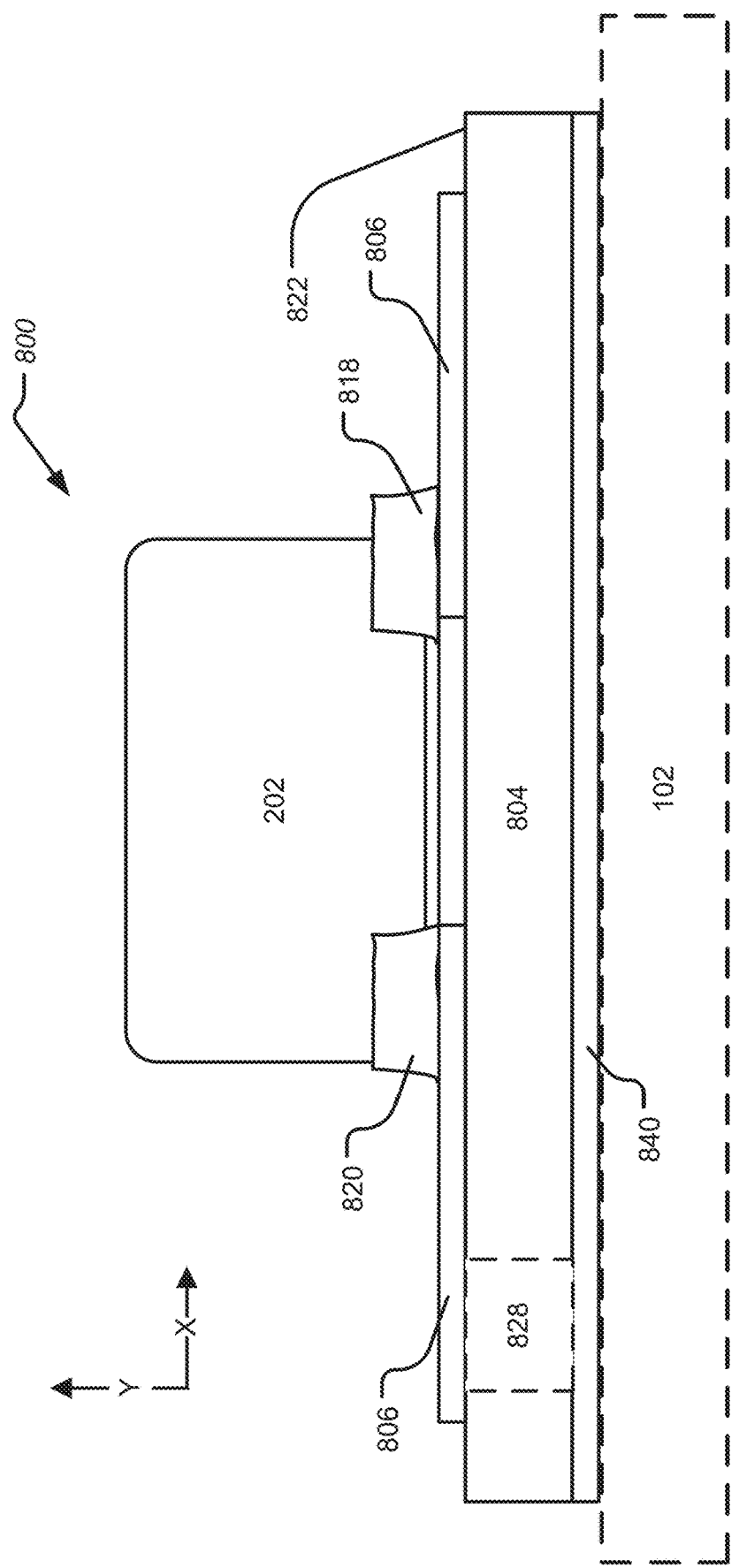
FIG. 22 illustrates a side view of a IPD components according to the disclosure.

FIG. 22 illustrates a side view of a IPD components according to the disclosure.

In particular, FIG. 22 illustrates exemplary implementations of the third IPD component 800 that may include any one or more other features, components, arrangements, and the like as described herein. With reference to FIG. 22, the third IPD component 800 may include a substrate 804, the at least one device 202, and/or the like.

The substrate 804 may be a printed circuit board (PCB) component, a ceramic component, a glass component, a low temperature co-fired ceramic (LTCC) component, a high temperature co-fired ceramic (HTCC) component, a thick film substrate component, and/or the like. In one or more aspects, the substrate 804 may include Teflon and/or hydrocarbon materials. In one or more aspects, the substrate 804 may include Teflon and/or hydrocarbon materials mixed with ceramic fillers. In one or more aspects, the substrate 804 may include Teflon and/or hydrocarbon materials mixed with ceramic fillers implemented as radio frequency (RF) materials.

With reference to FIG. 22, the substrate 804 may include an upper surface 822. The upper surface 822 may be located in a plane generally parallel to the x-axis or a plane generally parallel to the upper surface of the support 102. In this regard, generally may be defined to be within 0°-15°, 0°-2°, 2°-4°, 4°-6°, 6°-8°, 8°-10°, 10°-12°, or 12°-15°. The upper surface 822 may support the plurality of interconnect pads 806. The plurality of interconnect pads 806 may include multiple bond pad areas. The plurality of interconnect pads 806 may be formed by a metal surface on the upper surface 822 of the substrate 804 and may comprise a metallic material such as copper, gold, nickel, palladium, silver, and the like, and combinations thereof.

In some aspects, the at least one device 202 may include terminals arranged on a bottom surface. Accordingly, directly mounting a device such as the at least one device 202 to the support 102 of the package 100 would result in a short. For example, the at least one device 202 implemented as a surface mount device (SMD) component, such as a surface mount device (SMD) ceramic capacitor, may include one or more terminals arranged on a bottom surface of the surface mount device (SMD) component. Accordingly, mounting the at least one device 202 configured as a surface mount device (SMD) component to the support 102 of the package 100 would result in a short.

Accordingly, the disclosure utilizes the substrate 804 of the third IPD component 800 to support the at least one device 202. The substrate 804 may be mounted on an upper surface of the support 102. The substrate 804 may be mounted on the upper surface of the support 102 by an adhesive, soldering, sintering, eutectic bonding, ultrasonically welding, and/or the like as described herein. In one aspect, the substrate 804 may be directly mounted on the upper surface of the support 102. In one aspect, the substrate 804 may be mounted on the upper surface of the support 102 with intervening structures, components, and/or the like. The upper surface of the support 102 may be parallel to an x-axis; and the substrate 804 may be arranged vertically above the support 102 along a y-axis as illustrated in FIG. 22. In one aspect, the substrate 804 may be at least partially insulating. More specifically, the substrate 804 may at least partially insulate the at least one device 202 from the support 102.

In one aspect, the one or more of the plurality of interconnect pads 806 may be surfaces for bonding to the one or more interconnects 104. Accordingly, it may be beneficial to ensure that the surfaces of the plurality of interconnect pads 806 remain clean. In particular, attachment of the at least one device 202 to the plurality of interconnect pads 806 may result in solder transferring to other surfaces of the plurality of interconnect pads 806. Accordingly, the plurality of interconnect pads 806 may include a solder barrier arranged between various bond areas of the one or more interconnects 104 to the plurality of interconnect pads 806 and the bond areas of the at least one device 202 to the plurality of interconnect pads 806.

The upper surface 822 may further implement the plurality of interconnect pads 806 as a first terminal bond pad. The first terminal bond pad may be located in a plane generally parallel to the x-axis or a plane generally parallel to the upper surface 822. The first terminal bond pad may connect to a first terminal of the at least one device 202. In this regard, a first connection 820 may be formed between the first terminal bond pad and the first terminal. The first connection 820 may include an adhesive, soldering, sintering, eutectic bonding, ultrasonically welding, and/or the like as described herein. The first terminal bond pad may be formed by a metal surface on the upper surface 822 of the substrate 804 and may comprise a metallic material such as copper, gold, nickel, palladium, silver, and the like, and combinations thereof.

The upper surface 822 may further implement another one of the plurality of interconnect pads 806 as a second terminal bond pad. The second terminal bond pad may be located in a plane generally parallel to the x-axis or a plane generally parallel to the upper surface 822. The second terminal bond pad may connect to a second terminal of the at least one device 202. In this regard, a second connection 818 may be formed between the second terminal bond pad and the second terminal. The second terminal bond pad may be electrically connected in part to the plurality of interconnect pads 806. The second connection 818 may include an adhesive, soldering, sintering, eutectic bonding, ultrasonically welding, and/or the like as described herein. The second terminal bond pad may be formed by a metal surface on the upper surface 822 of the substrate 804 and may comprise a metallic material such as copper, gold, nickel, palladium, silver, and the like, and combinations thereof. Additionally, the upper surface 822 of the substrate 804 may include additional terminals for the at least one device 202 as needed.

The third IPD component 800 may include a metallization layer 840 located on a lower surface of the substrate 804 opposite the upper surface 822. The metallization layer 840 may be located in a plane generally parallel to the x-axis or a plane generally parallel to the upper surface 822. In one aspect, the metallization layer 840 may be implemented as a full face metallic layer on the lower surface of the substrate 804 opposite the upper surface 822. Additionally or alternatively, the third IPD component 800 may be single-sided having one metallic layer; the third IPD component 800 may be double-sided having two metallic layers on both sides of one substrate layer of the substrate 804; and/or the third IPD component 800 may be multi-layer having outer and inner layers of aluminum, copper, silver, gold, and/or the like, alternating with layers of substrate. The third IPD component 800 may include separate conducting lines, tracks, circuit traces, pads for connections, vias to pass connections between layers of aluminum, copper, silver, gold, and/or the like, and features such as solid conductive areas for EM shielding or other purposes.

Additionally, the third IPD component 800 may include vias 828. The vias 828 may extend from the plurality of interconnect pads 806 to the metallization layer 840. Accordingly, a terminal of the at least one device 202 may connect through the first connection 820 to the first terminal bond pad through the vias 828 at least to the metallization layer 840 to make an electrical connection and/or electrical contact with the support 102. The vias 828 may also extend through the metallization layer 840 to the support 102 to make an electrical connection and/or electrical contact with the support 102. In other aspects, the vias 828 may only be implemented as partial vias. The vias 828 may be metallic plated holes or metallic filled holes that may function as electrical tunnels through the substrate 804. The vias 828 may comprise a metallic material such as copper, gold, nickel, palladium, silver, and the like, and combinations thereof. The vias 828 may have an axis that may be located in a plane generally perpendicular to the x-axis, a plane generally parallel to the x-axis, and/or a plane generally perpendicular to the upper surface 822.

Additionally or alternatively the first IPD component 200 and/or the third IPD component 800 may include conductors on different layers that may be connected with vias, which may be metallic plated holes, such as copper-plated holes, aluminum-plated holes, silver-plated holes, gold-plated holes, and/or the like, that may function as electrical tunnels through the dielectric substrate. The first IPD component 200 and/or the third IPD component 800 may include "Through hole" components that may be mounted by their wire leads passing through the substrate and soldered to traces on the other side. The first IPD component 200 and/or the third IPD component 800 may include "Surface mount" components that may be attached by their leads and/or terminals.

The first IPD component 200, the metallization layer 240, the third IPD component 800 and/or the metallization layer 840 may be manufactured utilizing one or more manufacturing techniques including print screening or dispensing for solder paste, print screening or dispensing for epoxy, silk screen printing processes, photoengraving processes, print onto transparent film processes, photo mask processes, photo-sensitized board processes, laser resist ablation processes, milling processes, laser etching processes, and/or like processes. In one or more aspects, the first IPD component 200 and/or the third IPD component 800 may be configured to mechanically support and electrically connect the at least one device 202 to the first IPD component 200 and/or the third IPD component 800 and other electronic components.

In aspects, RF devices may be configured and implemented in the first IPD component 200, the second IPD component 300, and/or the third IPD component 800. In particular, the RF devices may be configured and implemented in the first IPD component 200, the second IPD component 300, and/or the third IPD component 800. The RF devices may include matching networks, harmonic termination circuitry, integrated passive devices (IPD), and the like.

In particular, the RF devices may be configured and implemented in the first IPD component 200, the second IPD component 300, and/or the third IPD component 800 as matching networks, harmonic termination circuitry, integrated passive devices (IPD), and the like and may utilize less-expensive ceramic-based surface mount devices (SMDs) that are typically mounted directly to traces on the first IPD component 200 to replace the more expensive silicon-based capacitors. In various aspects, the disclosure is directed to mounting the surface mount discrete device(s) (SMDs) onto the first IPD component 200, the second IPD component 300, and/or the third IPD component 800 implemented as a submount, which may be mounted on the support 102 such as the metal flange, the metal leadframe, the base, or the like. The submount may be wire bonded or the like to the RF devices such as the dies by input and/or output leads of the RF package, which may be metal based.

Additionally or alternatively the first IPD component 200 and/or the third IPD component 800 may include conductors on different layers that may be connected with vias, which may be metallic plated holes, such as copper-plated holes, aluminum-plated holes, silver-plated holes, gold-plated holes, and/or the like, that may function as electrical tunnels through the dielectric substrate. The first IPD component 200 and/or the third IPD component 800 may include "Through hole" components that may be mounted by their wire leads passing through the substrate and soldered to traces on the other side. The first IPD component 200 and/or the third IPD component 800 may include "Surface mount" components that may be attached by their leads and/or terminals.

The first IPD component 200 and/or the metallization layer 240 may be manufactured utilizing one or more manufacturing techniques including print screening or dispensing for solder paste, print screening or dispensing for epoxy, silk screen printing processes, photoengraving processes, print onto transparent film processes, photo mask processes, photo-sensitized board processes, laser resist ablation processes, milling processes, laser etching processes, and/or like processes. In one or more aspects, the first IPD component 200 may be configured to mechanically support and electrically connect the at least one device 202 to the first IPD component 200 and other electronic components.

Additionally, the first IPD component 200 and/or the third IPD component 800 may include a circuit structure, such as the circuit structure 260 illustrated in FIG. 13 of the first IPD component 200. In particular, the circuit structure may be arranged adjacent to the at least one device 202 and may be configured to provide an inductance, capacitance, resistance, and/or the like. In one aspect, the circuit structure may be a metallic surface arranged on the upper surface and together with the metallization layer, may create a capacitor. Additionally, the circuit structure may be configured as inductive strips, inductive coils, capacitive stubs, and/or the like. In one aspect, the circuit structure may implement a resistor such as a thin film resistor, a thick film resistor, a printed thin film resistor, a printed thick film resistor, and/or the like that may be arranged on the first IPD component 200 and/or the third IPD component 800, printed on the first IPD component 200 and/or the third IPD component 800, and/or the like.

In one aspect, the circuit structure may be implemented as an open ended shunt stub. In this regard, the circuit structure may be configured using a top metallization on the upper surface 222 on the substrate 204, with the dielectric of the substrate 204 and the bottom metallization implemented by the metallization layer 240 creating capacitance. The plurality of interconnect pads 206 implementing an open ended shunt stub may be inter-spaced between the at least one device 202 to form low value capacitances suitable for second harmonic or third harmonic optimization for the one or more semiconductor devices 400. The plurality of interconnect pads 206 implementing the harmonic shunt stubs may be arranged on the first IPD component 200 so that there may be one stub available for each of the one or more semiconductor devices 400. Additional capacitance areas may be created using a large continuous rectangular area implementation of the circuit structure connected to the shunt stubs and located behind a row of the vias 228.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

The package 100 may be implemented in any number of different applications. In this regard, the package 100 may be implemented in applications implementing high video bandwidth power amplifier transistors, a single path radio frequency power transistor, a single stage radio frequency power transistor, a multipath radio frequency power transistor, a Doherty configuration a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The package 100 may be implemented as a power package. The package 100 may be implemented as a power package and may implement applications and components as described herein.

The package 100 may be implemented as a radio frequency package. The package 100 may be implemented as a radio frequency package and may implement applications and components as described herein. The package 100 implemented as a radio frequency package may include, connect, support, or the like a transmitter, transmitter functions, a receiver, receiver functions, a transceiver, transceiver functions, and the like. The package 100 implemented as a radio frequency package may be configured to, may support, or the like transmitting a radio wave and modulating that wave to carry data with allowable transmitter power output, harmonics, and/or band edge requirements. The package 100 implemented as a radio frequency package may be configured to, may support, or the like receiving a radio wave and demodulating the radio wave. The package 100 implemented as a radio frequency package may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

The first IPD component 200, the second IPD component 300, and/or the third IPD component 800 may be an active device, a passive device, an IPD, a transistor device, or the like. The first IPD component 200, the second IPD component 300, and/or the third IPD component 800 may include any electrical component for any application. In this regard, the first IPD component 200 may be high video bandwidth power amplifier transistors, a single path radio frequency power transistor, a single stage radio frequency power transistor, a multipath radio frequency power transistor, a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The first IPD component 200, the second IPD component 300, and/or the third IPD component 800 may be implemented as a radio frequency device may be configured to, may support, or the like transmitting a radio wave and modulating that wave to carry data with allowable transmitter power output, harmonics, and/or band edge requirements. The first IPD component 200 implemented as a radio frequency device may be configured to, may support, or the like receiving a radio wave and demodulating the radio wave. The first IPD component 200, the second IPD component 300, and/or the third IPD component 800 may be implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

Figure 23:
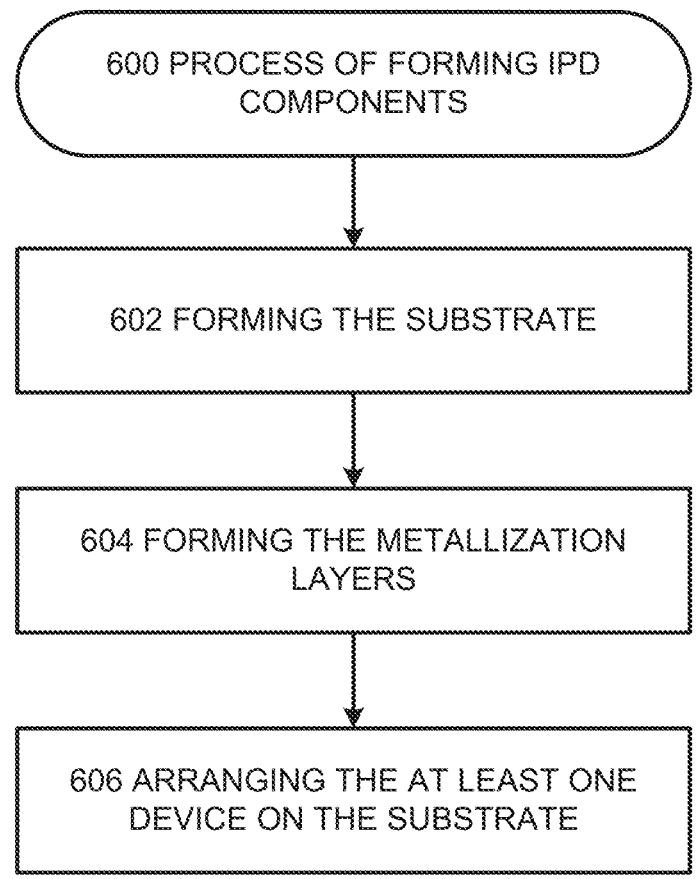
FIG. 23 shows a process of making IPD components according to the disclosure.

FIG. 23 shows a process of making IPD components according to the disclosure.

In particular, FIG. 23 illustrates a process of forming IPD components 600 that relates to the first IPD component 200, the second IPD component 300, and/or the third IPD component 800 as described herein. It should be noted that the aspects of the process of forming IPD components 600 may be performed in a different order consistent with the aspects described herein. Additionally, it should be noted that portions of the process of forming IPD components 600 may be performed in a different order consistent with the aspects described herein. Moreover, the process of forming IPD components 600 may be modified to have more or fewer processes consistent with the various aspects disclosed herein. Additionally, the process of forming IPD components 600 may include any other aspects of the disclosure described herein.

Initially, the process of forming IPD components 600 may include a process of forming the substrate 602. More specifically, the substrate 204, the substrate 304, and/or the substrate 804 may be constructed, configured, and/or arranged as described herein. Additionally, the vias 228 may be formed in the substrate 204, the vias 328 may be formed in the substrate 304, and/or the vias 828 may be formed in the substrate 804.

Further, the process of forming IPD components 600 may include forming the metallization layer 604. More specifically, the metallization layer 240 may be constructed, configured, and/or arranged as described herein on at least a portion of the substrate 204; the metallization layer 340 may be constructed, configured, and/or arranged as described herein on at least a portion of the substrate 304; and the metallization layer 840 may be constructed, configured, and/or arranged as described herein on at least a portion of the substrate 804. The process of forming the metallization layer 604 may include utilizing one or more manufacturing techniques including print screening for solder paste, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the forming the metallization layer 604 may include forming the interconnect pad. More specifically, the plurality of interconnect pads 206 may be constructed, configured, and/or arranged as described herein on the substrate 204. Additionally, the plurality of interconnect pads 306 may be constructed, configured, and/or arranged as described herein on the substrate 304. Further, the plurality of interconnect pads 806 may be constructed, configured, and/or arranged as described herein on the substrate 804. The process of forming the interconnect pad may include utilizing one or more manufacturing techniques including using print screening for solder past, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the forming the metallization layer 604 may include forming the bottom metal 366 together with the dielectric layer 362. The process of forming the bottom metal 366 may include utilizing one or more manufacturing techniques including using print screening for solder past, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes. Additionally, the process of forming IPD components 600 may include forming the cutouts 298 in the first IPD component 200. The cutouts 298 may be formed with a drill, a laser cut, a router, a saw, and/or the like.

Additionally, the process of forming IPD components 600 may include arranging the at least one device on the substrate 606. More specifically, the at least one device 202 may be constructed, configured, and/or arranged as described herein on the substrate 204 of the first IPD component 200 and/or the substrate 804 of the third IPD component 800. In one aspect, the at least one device 202 may be arranged as described herein on the substrate 204 with an adhesive, soldering, sintering, eutectic bonding, ultrasonically welding, and/or the like as described herein. In one aspect, the at least one device 202 may be arranged as described herein on the substrate 804 with an adhesive, soldering, sintering, eutectic bonding, ultrasonically welding, and/or the like as described herein.

More specifically, the process of forming IPD components 600 may include manufacturing to form the first IPD component 200, the second IPD component 300 and/or the third IPD component 800 in a panel, a wafer, and/or the like. The process of forming IPD components 600 may include implementing a pick and place assembly to place the at least one device 202 on the first IPD component 200 and/or the third IPD component 800 of the panel. The process of forming IPD components 600 may include implementing a reflow process with the panel. The process of forming IPD components 600 may include cutting the panel and/or the wafer utilizing cutting equipment such as wafer, circuit board, or package sawing equipment to singulate the first IPD component 200, the second IPD component 300, and/or the third IPD component 800 from the panel or the wafer, which may have the advantage that the first IPD component 200, the second IPD component 300 and/or the third IPD component 800 may be arranged on dicing tape on a ring frame, which can be directly loaded to the Die Attach equipment for subsequent assembly into package 100.

In one aspect, the process of forming IPD components 600 may include may processing utilizing a surface mount technology (SMT) line. A surface mount technology (SMT) line may utilize numerous processes including solder printing, component placement, solder reflow, and/or the like. additional processes may include a flux cleaning step to remove all flux residues, wire bonding, dicing, mounting to dicing tape, dicing, either mechanical sawing or laser cutting, or a combination of both, and component testing. Additionally, the first IPD component 200, the second IPD component 300, and/or the third IPD component 800 may be arranged on dicing tape that may then serve as input for the Die Attach equipment.

Figure 24:
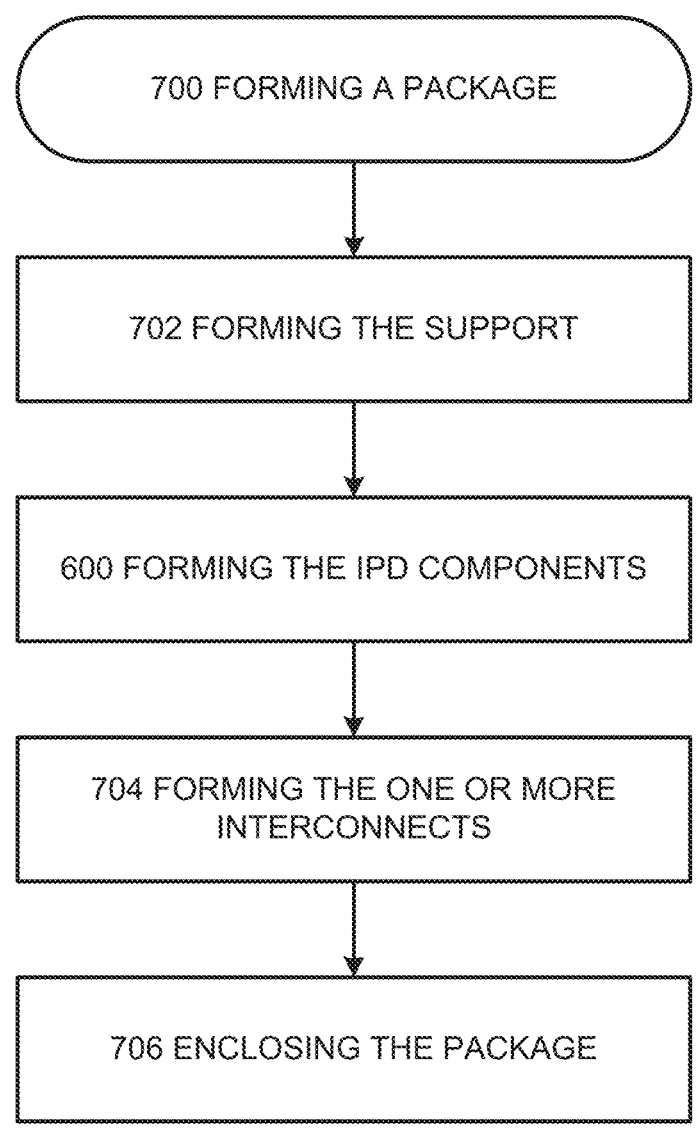
FIG. 24 shows a process of making a package according to the disclosure.

FIG. 24 shows a process of making a package according to the disclosure.

In particular, FIG. 24 illustrates a process of forming a package 700 that relates to the package 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein. Additionally, the process of forming a package 700 may include any other aspects of the disclosure described herein.

Initially, the process of forming a package 700 may include a process of forming the support 702. More specifically, the support 102 may be constructed, configured, and/or arranged as described herein. In one aspect, the process of forming the support 702 may include forming the support 102 as a support, a surface, a package support, a package surface, a package support surface, a flange, a heat sink, a common source heat sink, and/or the like.

The process of forming a package 700 may include a process of forming IPD components 600. More specifically, the first IPD component 200, the second IPD component 300, and/or the third IPD component 800 may be constructed, configured, and/or arranged as described herein with reference to FIG. 23 and the associated description thereof. Thereafter, the process of forming IPD components 600 may further include attaching the first IPD component 200, the second IPD component 300, and/or the third IPD component 800 to the support 102. In this regard, the first IPD component 200, the second IPD component 300, and/or the third IPD component 800 may be mounted on the upper surface of the support 102 and/or the first IPD component 200 by an adhesive, soldering, sintering, eutectic bonding, ultrasonically welding, and/or the like as described herein.

The process of forming a package 700 may include a process of forming the one or more interconnects 704. More specifically, the one or more interconnects 104 may be constructed, configured, and/or arranged as described herein. In one aspect, the process of forming the one or more interconnects 704 may include forming the one or more interconnects 104 by forming one or more wires, leads, vias, edge platings, circuit traces, tracks, and/or the like. In one aspect, the process of forming the one or more interconnects 704 may include connecting the one or more interconnects 704 by an adhesive, soldering, sintering, eutectic bonding, ultrasonic welding, a clip component, and/or the like as described herein.

The process of forming a package 700 may include a process of enclosing the package 706. More specifically, the package 100 may be constructed, configured, and/or arranged as described herein. In one aspect, the process of enclosing the package 706 may include forming an open cavity configuration, an over-mold configuration, or the like.

Accordingly, the disclosure has provided a number of different IPD components, a RF product that implements a number of different types of IPD components, and/or the like configured for utilization of a number of components, increased functionality, and efficient utilization of space.

The following are a number of nonlimiting Examples of aspects of the disclosure. One example includes EXAMPLE 1. A transistor device, includes, a metal submount; a transistor die arranged on said metal submount; a first integrated passive device (IPD) component includes a first substrate arranged on said metal submount; and a second integrated passive device (IPD) component includes a second substrate arranged on the metal submount, where the first substrate is a different material from the second substrate.

The above-noted Example may further include any one or a combination of more than one of the following EXAMPLES: 2. The transistor device according to any EXAMPLE herein where: the first integrated passive device (IPD) component includes a printed circuit board (PCB) substrate; and the second integrated passive device (IPD) component includes a silicon carbide (SiC) substrate. 3. The transistor device according to any EXAMPLE herein where: the first integrated passive device (IPD) component includes a printed circuit board (PCB) integrated passive device (IPD); and the second integrated passive device (IPD) component includes a silicon carbide (SiC) integrated passive device (IPD). 4. The transistor device according to any EXAMPLE herein where the second integrated passive device (IPD) component includes a cut out portion configured to receive the second integrated passive device (IPD) component. 5. The transistor device according to any EXAMPLE herein where the first integrated passive device (IPD) component includes a surface mount device mounted to a top surface of the first integrated passive device (IPD) component. 6. The transistor device according to any EXAMPLE herein where the first substrate includes at least one via configured to make an electrical connection between the surface mount device and the metal submount. 7. The transistor device according to any EXAMPLE herein where the first integrated passive device (IPD) component is arranged between the second integrated passive device (IPD) component and the metal submount. 8. The transistor device according to any EXAMPLE herein where the second integrated passive device (IPD) component is arranged between the first integrated passive device (IPD) component and the metal submount. 9. The transistor device according to any EXAMPLE herein includes a third IPD component includes a third substrate, where the first substrate is a same material as the third substrate. 10. The transistor device according to any EXAMPLE herein where the third IPD component includes a surface mount device mounted to a top surface of the third IPD component. 11. The transistor device according to any EXAMPLE herein where the third substrate includes at least one via configured to make an electrical connection between the surface mount device and the metal submount. 12. The transistor device according to any EXAMPLE herein where the third IPD component includes a printed circuit board (PCB) integrated passive device (IPD). 13. The transistor device according to any EXAMPLE herein where the third IPD component includes a printed circuit board (PCB) substrate. 14. The transistor device according to any EXAMPLE herein where the transistor die includes one or multiple LDMOS transistor die. 15. The transistor device according to any EXAMPLE herein where the transistor die includes one or multiple GaN based HEMTs. 16. The transistor device according to any EXAMPLE herein where the transistor device includes a plurality of the transistor die. 17. The transistor device according to any EXAMPLE herein where the plurality of the transistor die are configured in a Doherty configuration.

One example includes EXAMPLE 18. A process for implementing a transistor device, includes, providing a metal submount; arranging a transistor die on said metal submount; arranging a first integrated passive device (IPD) component includes a first substrate on said metal submount; and arranging a second integrated passive device (IPD) component includes a second substrate on the metal submount, where the first substrate is a different material from the second substrate.

The above-noted Example may further include any one or a combination of more than one of the following EXAMPLES: 19. The process for implementing a transistor device according to any EXAMPLE herein where: the first integrated passive device (IPD) component includes a printed circuit board (PCB) substrate; and the second integrated passive device (IPD) component includes a silicon carbide (SiC) substrate. 20. The process for implementing a transistor device according to any EXAMPLE herein where: the first integrated passive device (IPD) component includes a printed circuit board (PCB) integrated passive device (IPD); and the second integrated passive device (IPD) component includes a silicon carbide (SiC) integrated passive device (IPD). 21. The process for implementing a transistor device according to any EXAMPLE herein includes forming a cutout portion in the second integrated passive device (IPD) component configured to receive the second integrated passive device (IPD) component. 22. The process for implementing a transistor device according to any EXAMPLE herein includes mounting a surface mount device to a top surface of the first integrated passive device (IPD) component. 23. The process for implementing a transistor device according to any EXAMPLE herein includes forming at least one via in the first substrate configured to make an electrical connection between the surface mount device and the metal submount. 24. The process for implementing a transistor device according to any EXAMPLE herein includes arranging the first integrated passive device (IPD) component between the second integrated passive device (IPD) component and the metal submount. 25. The process for implementing a transistor device according to any EXAMPLE herein includes arranging the second integrated passive device (IPD) component between the first integrated passive device (IPD) component and the metal submount. 26. The process for implementing a transistor device according to any EXAMPLE herein includes providing a third IPD component includes a third substrate, where the first substrate is a same material as the third substrate. 27. The process for implementing a transistor device according to any EXAMPLE herein includes mounting a surface mount device to a top surface of the third IPD component. 28. The process for implementing a transistor device according to any EXAMPLE herein includes forming at least one via in the third substrate configured to make an electrical connection between the surface mount device and the metal submount. 29. The process for implementing a transistor device according to any EXAMPLE herein where the third IPD component includes a printed circuit board (PCB) integrated passive device (IPD). 30. The process for implementing a transistor device according to any EXAMPLE herein where the third IPD component includes a printed circuit board (PCB) substrate. 31. The process for implementing a transistor device according to any EXAMPLE herein where the transistor die includes one or multiple LDMOS transistor die. 32. The process for implementing a transistor device according to any EXAMPLE herein where the transistor die includes one or multiple GaN based HEMTs. 33. The process for implementing a transistor device according to any EXAMPLE herein where the transistor device includes a plurality of the transistor die. 34. The process for implementing a transistor device according to any EXAMPLE herein where the plurality of the transistor die are configured in a Doherty configuration.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A transistor device, comprising,
a metal submount;
a transistor die arranged on said metal submount;
a first integrated passive device (IPD) component comprising a first substrate arranged on said metal submount; and
a second integrated passive device (IPD) component comprising a second substrate arranged on the metal submount,
wherein the first substrate is a different material from the second substrate;
wherein the first integrated passive device (IPD) component comprises a printed circuit board (PCB) substrate; and
wherein the second integrated passive device (IPD) component comprises a silicon carbide (SiC) substrate.

2. The transistor device according to claim 1 wherein the second integrated passive device (IPD) component comprises a cut out portion configured to receive the second integrated passive device (IPD) component.

3. The transistor device according to claim 1 wherein the first integrated passive device (IPD) component comprises a surface mount device mounted to a top surface of the first integrated passive device (IPD) component.

4. The transistor device according to claim 3 wherein the first substrate comprises at least one via configured to make an electrical connection between the surface mount device and the metal submount.

5. The transistor device according to claim 1 wherein the first integrated passive device (IPD) component is arranged between the second integrated passive device (IPD) component and the metal submount.

6. The transistor device according to claim 1 wherein the second integrated passive device (IPD) component is arranged between the first integrated passive device (IPD) component and the metal submount.

7. The transistor device according to claim 1 further comprising a third IPD component comprising a third substrate,
wherein the first substrate is a same material as the third substrate.

8. The transistor device according to claim 7 wherein the third IPD component comprises a surface mount device mounted to a top surface of the third IPD component.

9. The transistor device according to claim 8 wherein the third substrate comprises at least one via configured to make an electrical connection between the surface mount device and the metal submount.

10. The transistor device according to claim 7 wherein the third IPD component comprises a printed circuit board (PCB) integrated passive device (IPD).

11. The transistor device according to claim 7 wherein the third IPD component comprises a printed circuit board (PCB) substrate.

12. The transistor device according to claim 1 wherein the transistor die comprises one or multiple LDMOS transistor die.

13. The transistor device according to claim 1 wherein the transistor die comprises one or multiple GaN based HEMTs.

14. The transistor device according to claim 1 wherein the transistor device comprises a plurality of the transistor die.

15. The transistor device according to claim 14 wherein the plurality of the transistor die are configured in a Doherty configuration.

16. A transistor device, comprising,
a metal submount;
a transistor die arranged on said metal submount;
a first integrated passive device (IPD) component comprising a first substrate arranged on said metal submount; and
a second integrated passive device (IPD) component comprising a second substrate arranged on the metal submount,
wherein the first substrate is a different material from the second substrate;
wherein the first integrated passive device (IPD) component comprises a printed circuit board (PCB) integrated passive device (IPD); and
wherein the second integrated passive device (IPD) component comprises a silicon carbide (SiC) integrated passive device (IPD).

17. A process for implementing a transistor device, comprising,
providing a metal submount;
arranging a transistor die on said metal submount;
arranging a first integrated passive device (IPD) component comprising a first substrate on said metal submount; and
arranging a second integrated passive device (IPD) component comprising a second substrate on the metal submount,
wherein the first substrate is a different material from the second substrate;
wherein the first integrated passive device (IPD) component comprises a printed circuit board (PCB) substrate; and
wherein the second integrated passive device (IPD) component comprises a silicon carbide (SiC) substrate.

18. The process for implementing a transistor device according to claim 17 wherein:
the first integrated passive device (IPD) component comprises a printed circuit board (PCB) integrated passive device (IPD); and
the second integrated passive device (IPD) component comprises a silicon carbide (SiC) integrated passive device (IPD).

19. The process for implementing a transistor device according to claim 17 further comprising forming a cut out portion in the second integrated passive device (IPD) component configured to receive the second integrated passive device (IPD) component.

20. The process for implementing a transistor device according to claim 17 further comprising mounting a surface mount device to a top surface of the first integrated passive device (IPD) component.

21. The process for implementing a transistor device according to claim 20 further comprising forming at least one via in the first substrate configured to make an electrical connection between the surface mount device and the metal submount.

22. The process for implementing a transistor device according to claim 17 further comprising arranging the first integrated passive device (IPD) component between the second integrated passive device (IPD) component and the metal submount.

23. The process for implementing a transistor device according to claim 17 further comprising arranging the second integrated passive device (IPD) component between the first integrated passive device (IPD) component and the metal submount.

24. The process for implementing a transistor device according to claim 17 further comprising providing a third IPD component comprising a third substrate,
wherein the first substrate is a same material as the third substrate.

25. The process for implementing a transistor device according to claim 24 further comprising mounting a surface mount device to a top surface of the third IPD component.

26. The process for implementing a transistor device according to claim 25 further comprising forming at least one via in the third substrate configured to make an electrical connection between the surface mount device and the metal submount.

27. The process for implementing a transistor device according to claim 24 wherein the third IPD component comprises a printed circuit board (PCB) integrated passive device (IPD).

28. The process for implementing a transistor device according to claim 24 wherein the third IPD component comprises a printed circuit board (PCB) substrate.

29. The process for implementing a transistor device according to claim 17 wherein the transistor die comprises one or multiple LDMOS transistor die.

30. The process for implementing a transistor device according to claim 17 wherein the transistor die comprises one or multiple GaN based HEMTs.

31. The process for implementing a transistor device according to claim 17 wherein the transistor device comprises a plurality of the transistor die.

32. The process for implementing a transistor device according to claim 31 wherein the plurality of the transistor die are configured in a Doherty configuration.

* * * * *